(12) United States Patent
Yoneda et al.

(10) Patent No.: US 11,849,234 B2
(45) Date of Patent: Dec. 19, 2023

(54) IMAGING DEVICE OR IMAGING SYSTEM

(71) Applicant: SEMICONDUCTOR ENERGY LABORATORY CO., LTD., Atsugi (JP)

(72) Inventors: Seiichi Yoneda, Kanagawa (JP); Hiromichi Godo, Kanagawa (JP); Yusuke Negoro, Osaka (JP); Hiroki Inoue, Kanagawa (JP); Takahiro Fukutome, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 17 days.

(21) Appl. No.: 17/630,074

(22) PCT Filed: Jul. 28, 2020

(86) PCT No.: PCT/IB2020/057087
§ 371 (c)(1),
(2) Date: Jan. 25, 2022

(87) PCT Pub. No.: WO2021/028754
PCT Pub. Date: Feb. 18, 2021

(65) Prior Publication Data
US 2022/0279140 A1 Sep. 1, 2022

(30) Foreign Application Priority Data
Aug. 9, 2019 (JP) .................. 2019-147275

(51) Int. Cl.
*H04N 25/75* (2023.01)
*H04N 25/46* (2023.01)
*H04N 25/71* (2023.01)

(52) U.S. Cl.
CPC ............. *H04N 25/75* (2023.01); *H04N 25/46* (2023.01); *H04N 25/745* (2023.01)

(58) Field of Classification Search
CPC .... H04N 23/698; H04N 23/951; H04N 25/44; H04N 25/443; H04N 25/46; H04N 25/70;
(Continued)

(56) References Cited

U.S. PATENT DOCUMENTS

| 8,378,391 B2 | 2/2013 | Koyama et al. |
| 8,916,869 B2 | 12/2014 | Koyama et al. |

(Continued)

FOREIGN PATENT DOCUMENTS

| CN | 110651468 A | 1/2020 |
| JP | 10-155109 A | 6/1998 |

(Continued)

OTHER PUBLICATIONS

International Search Report (Application No. PCT/IB2020/057087) dated Oct. 27, 2020.

(Continued)

*Primary Examiner* — Lin Ye
*Assistant Examiner* — Chriss S Yoder, III
(74) *Attorney, Agent, or Firm* — Fish & Richardson P.C.

(57) ABSTRACT

An imaging device with a novel structure is provided. The imaging device includes an imaging region provided with a plurality of pixels. The plurality of pixels included in the imaging region include a first pixel and a second pixel. The imaging device has a function of selecting a first region or a second region. The first region includes the same number of pixels as the second region. The first region includes at least the first and second pixels. The second region includes at least the second pixel. The pixels included in the first region or the second region have a function of outputting imaging signals obtained by the pixels. The imaging device generates first image data by concurrently reading the imaging signals output from the pixels included in the first region and performing arithmetic operation on the signals. The (Continued)

imaging device generates second image data by concurrently reading the imaging signals output from the pixels included in the second region and performing arithmetic operation on the signals. A first conceptual image can be generated with the use of the first image data and the second image data.

8 Claims, 26 Drawing Sheets

(58) Field of Classification Search
CPC .............................. H04N 25/745; H04N 25/75; H01L 27/14603; H01L 27/14609; H01L 27/14634; H01L 27/14665
See application file for complete search history.

(56) References Cited

U.S. PATENT DOCUMENTS

| | | | |
|---|---|---|---|
| 9,331,112 | B2 | 5/2016 | Koyama et al. |
| 9,773,814 | B2 | 9/2017 | Koyama et al. |
| 9,773,832 | B2 | 9/2017 | Kurokawa |
| 10,074,687 | B2 | 9/2018 | Kurokawa |
| 10,600,839 | B2 | 3/2020 | Kurokawa |
| 10,964,743 | B2 | 3/2021 | Kurokawa |
| 11,101,302 | B2 | 8/2021 | Ikeda et al. |
| 2015/0146052 | A1* | 5/2015 | Sawadaishi ............... G02B 7/34 |
| | | | 348/266 |
| 2016/0172410 | A1 | 6/2016 | Kurokawa |
| 2019/0109994 | A1* | 4/2019 | Kikuchi ................ H04N 25/134 |
| 2020/0314361 | A1* | 10/2020 | Kim ........................ H04N 25/40 |
| 2021/0151486 | A1 | 5/2021 | Kobayashi et al. |
| 2021/0233952 | A1 | 7/2021 | Kurokawa |
| 2021/0384239 | A1 | 12/2021 | Ikeda et al. |

FOREIGN PATENT DOCUMENTS

| | | |
|---|---|---|
| JP | 2011-119711 A | 6/2011 |
| JP | 2013-185862 A | 9/2013 |
| JP | 2016-123087 A | 7/2016 |
| KR | 2020-0012917 A | 2/2020 |
| WO | WO-2018/215882 | 11/2018 |
| WO | WO-2019/012370 | 1/2019 |

OTHER PUBLICATIONS

Written Opinion (Application No. PCT/IB2020/057087) dated Oct. 27, 2020.

Dong.C et al., "Image Super-Resolution Using Deep Convolutional Networks", arXiv:1501.00092v3, Jul. 31, 2015, pp. 1-14. Cornell University.

* cited by examiner

FIG. 25A1
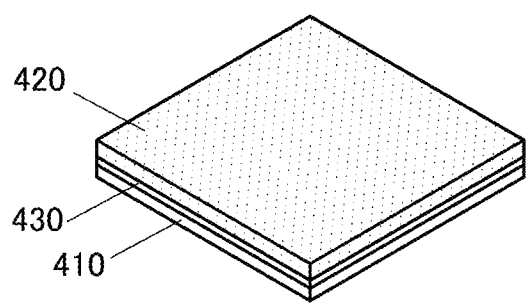
FIG. 25B1
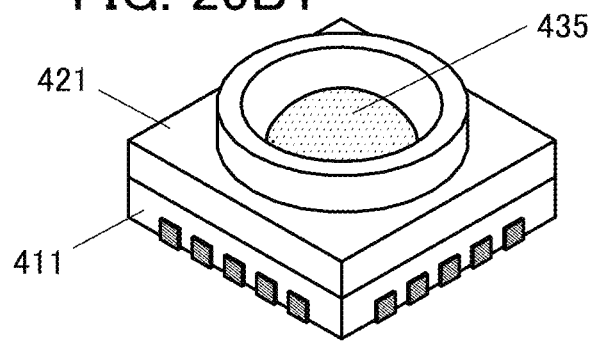
FIG. 25A2
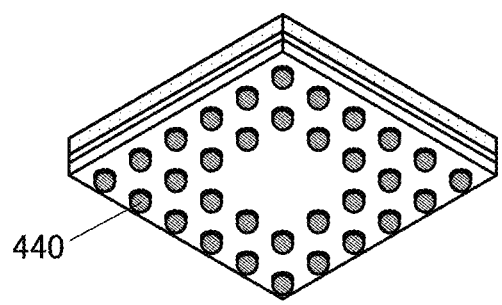
FIG. 25B2
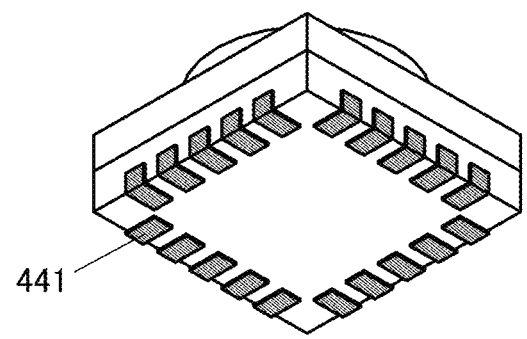
FIG. 25A3
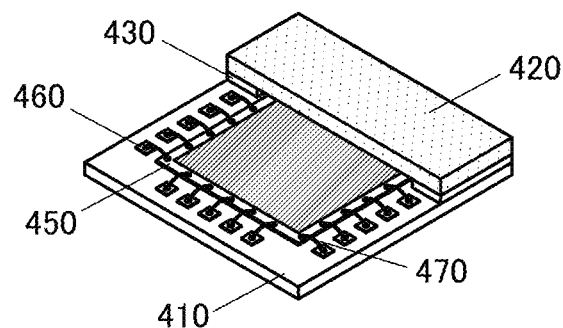
FIG. 25B3
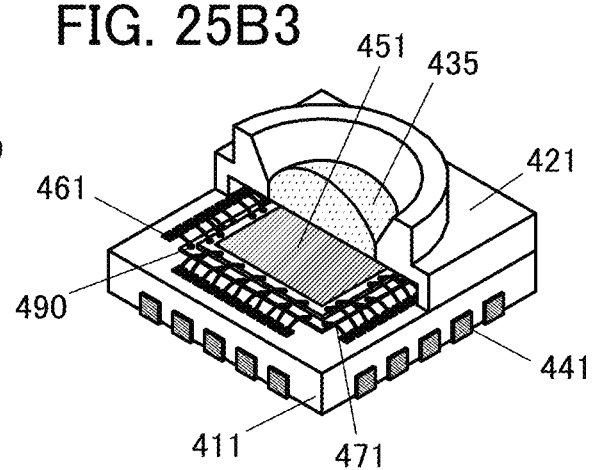

IMAGING DEVICE OR IMAGING SYSTEM

CROSS REFERENCE TO RELATED APPLICATIONS

This application is a U.S. National Phase Application under 35 U.S.C. § 371 of International Application PCT/IB2020/057087, filed on Jul. 28, 2020, which is incorporated by reference and claims the benefit of a foreign priority application filed in Japan on Aug. 9, 2019, as Application No. 2019-147275.

TECHNICAL FIELD

One embodiment of the present invention relates to an imaging device or an imaging system including the imaging device.

Note that one embodiment of the present invention is not limited to the above technical field. The technical field of one embodiment of the invention disclosed in this specification and the like relates to an object, a method, or a manufacturing method. In particular, one embodiment of the present invention relates to a semiconductor device, an imaging device, a light-receiving device, a memory device, a driving method thereof, or a manufacturing method thereof.

In this specification and the like, a semiconductor device means an element, a circuit, a device, or the like that can function by utilizing semiconductor characteristics. For example, a semiconductor element such as a transistor, a diode, a light-receiving element, or a light-emitting element is a semiconductor device. For another example, a circuit including a semiconductor element is a semiconductor device. For another example, a device provided with a circuit including a semiconductor element is a semiconductor device.

BACKGROUND ART

In recent years, image recognition using artificial intelligence (AI) has been developed. The recognition rate of a subject in an image has been continuously increasing. Note that AI can support learned contents but it is difficult for AI to recognize a component or the like from an image that the AI has never learned or explain such a component or the like.

For example, in manufacturing process, appearance inspection is performed to inspect entry of a foreign matter during manufacturing, a manufacturing failure, or the like. Efficient appearance inspection employing appearance inspection employing image inspection has been recently developed. For example, for machine vision (an image processing system using a computer system), various kinds of detection algorithm have been proposed. Among these, algorithm that got a hint from a human visual mechanism has been proposed (Patent Document 1). The algorithm got a hint from peripheral vision and fixational eye movement of a human visual mechanism, and can sense an abnormal portion existing in a regular pattern.

REFERENCE

Patent Document

[Patent Document 1] Japanese Published Patent Application No. 2013-185862

SUMMARY OF THE INVENTION

Problems to be Solved by the Invention

In the case where algorithm that extracts a feature from an image is digitally processed with a processor or a GPU (Graphics Processing Unit) without using teacher data, there is a problem in that power consumption increases in proportion to the amount of arithmetic operation. That is, there is a problem in that the size of a target image is proportional to the amount of arithmetic operation and power consumption. In addition, in the case of using the algorithm, there is a problem in that processing time extends in proportion to the amount of arithmetic operation. Moreover, since the algorithm handles data that is larger than image size in intermediate processing, there is a problem in that a data region that is larger than image size is needed.

In view of the above problems, an object of one embodiment of the present invention is to provide an imaging device with a novel structure. An object of one embodiment of the present invention is to provide an imaging device that can handle data that is larger than an imaging region. An object of one embodiment of the present invention is to provide an imaging device that suppresses an extension of arithmetic processing time. An object of one embodiment of the present invention is to provide an imaging device that suppresses an increase in power consumption.

An object of one embodiment of the present invention is to provide an imaging system with a novel structure. An object of one embodiment of the present invention is to provide an imaging system that can handle data that is larger than an imaging region. An object of one embodiment of the present invention is to provide an imaging system that suppresses an extension of arithmetic processing time. An object of one embodiment of the present invention is to provide an imaging system that suppresses an increase in power consumption.

Note that the description of these objects does not preclude the existence of other objects. One embodiment of the present invention does not have to achieve all these objects. Other objects will be apparent from the descriptions of the specification, the drawings, the claims, and the like, and other objects can be derived from the descriptions of the specification, the drawings, the claims, and the like.

Means for Solving the Problems

An imaging device including a first region and a second region in an imaging region. The first region and the second region include the same number of a plurality of pixels. The first region includes a first pixel and a second pixel in the plurality of pixels. The second region includes the second pixel in the plurality of pixels. First image data is generated in accordance with imaging signals output from the plurality of pixels in the first region. Second image data is generated in accordance with imaging signals output from the plurality of pixels in the second region. A first conceptual image is generated in accordance with the first image data and the second image data.

In the above structure, the first image data is preferably generated by averaging processing on the imaging signals output from the plurality of pixels in the first region. The second image data is preferably generated by averaging processing on the imaging signals output from the plurality of pixels in the second region.

In each of the above structures, each of the plurality of pixels in the first region preferably has a function of converting the imaging signals output from the plurality of pixels into first imaging signals when supplied with weight coefficients. Each of the plurality of pixels in the second region preferably has a function of converting the imaging signals output from the pixels into second imaging signals when supplied with the weight coefficients. The first image data is preferably generated by adding the first imaging signals output from the plurality of pixels in the first region together. The second image data is preferably generated by adding the second imaging signals output from the plurality of pixels in the second region together.

In each of the above structures, the first region and the second region are preferably composed of the pixels selected using an integral row and an integral column as units.

In each of the above structures, a first circuit is preferably further included. The first circuit preferably has a function of retaining a potential. The first circuit preferably has a function of a substitution for the pixel in the first region or the first region.

In each of the above structures, a transistor of the pixel preferably includes a metal oxide in a semiconductor layer.

Another embodiment of the present invention is an imaging system including an imaging region provided with a plurality of pixels. The imaging region includes a first pixel, a second pixel, and a third pixel in the plurality of pixels. The imaging system includes a step of obtaining imaging signals by the plurality of pixels; a step of setting a first region including the first pixel to the third pixel in the imaging region; a step of generating first phase image data in accordance with the imaging signals obtained by the first pixel and the second pixel in the first region; a step of generating second phase image data in accordance with the imaging signals obtained by the second pixel and the third pixel in the first region; and a step of generating first image data by performing arithmetic operation on the first phase image data and the second phase image data.

In each of the above structures, the first image data is preferably an image including a feature extracted from the imaging signal.

Effect of the Invention

In view of the above problems, one embodiment of the present invention can provide an imaging device with a novel structure. One embodiment of the present invention can provide an imaging device that can handle data that is larger than an imaging region. One embodiment of the present invention can provide an imaging device that suppresses an extension of arithmetic processing time. One embodiment of the present invention can provide an imaging device that suppresses an increase in power consumption.

One embodiment of the present invention can provide an imaging system with a novel structure. One embodiment of the present invention can provide an imaging system that can handle data that is larger than an imaging region. One embodiment of the present invention can provide an imaging system that suppresses an extension of arithmetic processing time. One embodiment of the present invention can provide an imaging system that suppresses an increase in power consumption.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

BRIEF DESCRIPTION OF THE DRAWINGS

FIG. 25A1 to FIG. 25A3 and FIG. 25B1 to FIG. 25B3 are perspective views of a package and a module in which an imaging device is placed.

MODE FOR CARRYING OUT THE INVENTION

Figure 1:
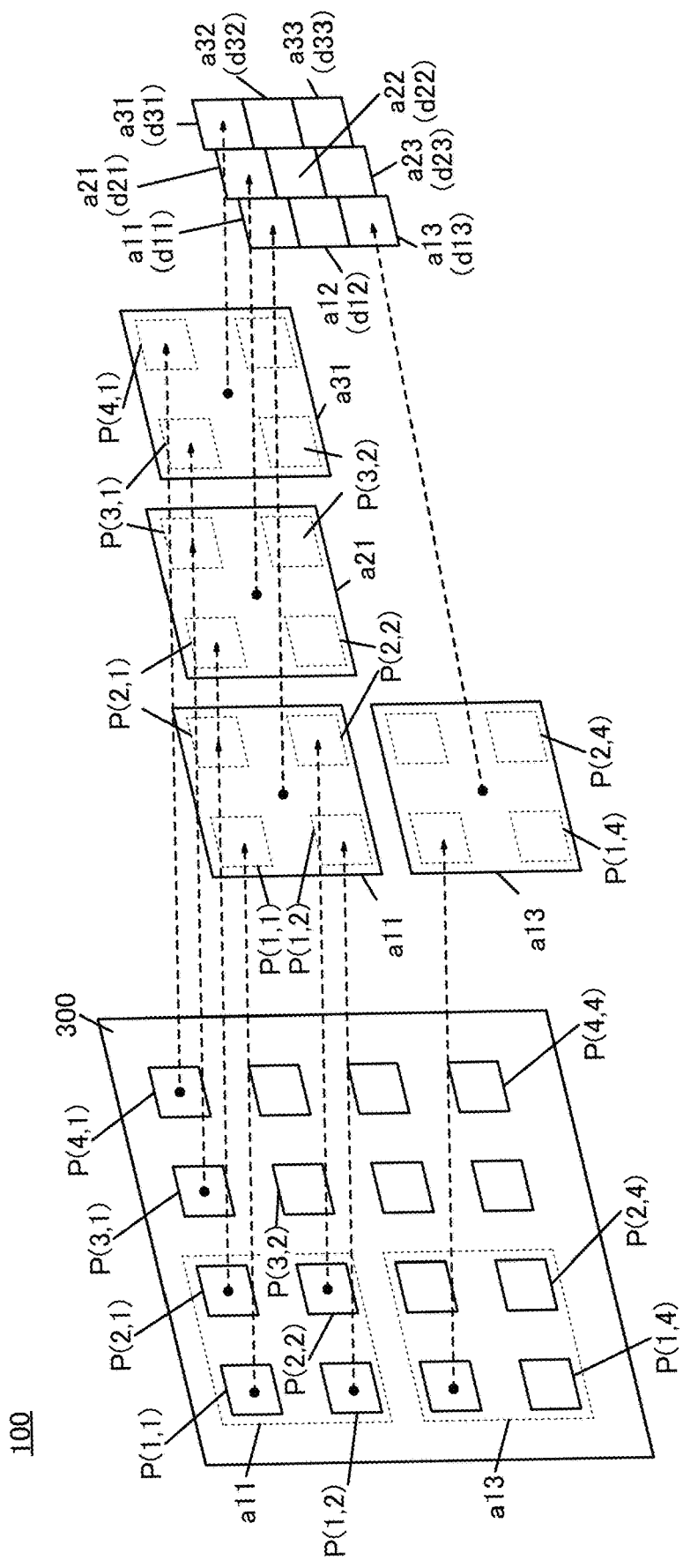
FIG. 1 is a diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, the resistance value of a "resistor" is sometimes determined depending on the length of a wiring. Alternatively, a resistor includes a case where it can be formed by connection between a conductive layer used for a wiring and another conductive layer with a low efficiency different from that of the conductive layer through a contact. Alternatively, a resistance value is sometimes determined by impurity doping in a semiconductor layer.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over", "above", "under", or "below" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B. For example, the expression "conductive layer D over conductive layer C" does not necessarily mean that the conductive layer D is formed on and in direct contact with the conductive layer C, and does not exclude the case where another component is provided between the conductive layer C and the conductive layer D. The term "above" or "below" does not exclude the case where a component is placed in an oblique direction.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit. Furthermore, the expression "directly connected" includes the case where a wiring is formed in different conductive layers through a contact. Therefore, a wiring may be formed of conductive layers that contain one or more of the same elements or may be formed of conductive layers that contain different elements.

In this specification and the like, "parallel" indicates a state where two straight lines are placed at an angle of greater than or equal to $-10°$ and less than or equal to $10°$, for example. Accordingly, the case where the angle is greater than or equal to $-5°$ and less than or equal to $5°$ is also included. Furthermore, the terms "perpendicular" and "orthogonal" indicate a state where two straight lines are placed at an angle of greater than or equal to $80°$ and less than or equal to $100°$, for example. Accordingly, the case where the angle is greater than or equal to $85°$ and less than or equal to $95°$ is also included.

In this specification and the like, the terms "identical", "same", "equal", "uniform", and the like used in describing calculation values and measurement values allow for a margin of error of $±20\%$ unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply voltage VDD (hereinafter, also simply referred to as "VDD", "H voltage", or "H") is a power supply voltage higher than a low power supply voltage VSS (hereinafter, also simply referred to as "VSS", "L voltage", or "L").

Furthermore, VSS is a power supply voltage lower than VDD. A ground voltage (hereinafter, also simply referred to as "GND" or "GND voltage") can be used as VDD or VSS. For example, in the case where VDD is a ground voltage, VSS is a voltage lower than the ground voltage, and in the case where VSS is a ground voltage, VDD is a voltage higher than the ground voltage.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

In this embodiment, an imaging device of one embodiment of the present invention will be described. The imaging device includes an imaging region provided with a plurality of pixels. The plurality of pixels included in the imaging region include a first pixel and a second pixel. The imaging device can select a first region and a second region, for example. The first region and the second region are each composed of pixels specified using an integral row in the row direction and an integral column in the column direction as units. Thus, a pixel group specified as the first region can be regarded as one unit. That is, it means that the imaging region is divided by the first region. The second region preferably includes the same number of pixels as the first region. Note that the first region preferably includes at least the first pixel and the second pixel, and the second region preferably includes at least the second pixel. The pixels included in the first region or the second region output imaging signals obtained by the pixels.

The imaging device can generate first image data by concurrently reading the imaging signals output from the pixels included in the first region and performing arithmetic operation on the signals. The imaging device can generate second image data by concurrently reading the imaging signals output from the pixels included in the second region and performing arithmetic operation on the signals. Note that the arithmetic operation preferably includes averaging processing or the like.

Note that the imaging signal output from the pixel included in the first region may be converted into a first imaging signal when a weight coefficient is supplied to the pixel. The imaging signal output from the pixel included in the second region may be converted into a second imaging signal when a weight coefficient is supplied to the pixel. Thus, by adding the first imaging signals together, the imaging signals output from the pixels included in the first region can have the same values as the imaging signals output from the pixels included in the first region on which averaging processing is performed. By adding the second imaging signals together, the imaging signals output from the pixels included in the second region can have the same values as the imaging signals output from the pixels included in the second region on which averaging processing is performed.

Therefore, the imaging device can generate a first conceptual image with the use of the first image data and the second image data. The first conceptual image is an image including a discontinuous feature extracted from an image taken by the imaging device.

Note that in the case where the second region is set, the range of the second region may include a region outside the imaging region. In other words, the number of pixels that are necessarily included in the second region might be insufficient in the imaging range. In the above-described case, the imaging device preferably includes a first circuit that functions instead of an insufficient pixel in the second region. It is preferable that the first circuit have a function of a memory device, and the memory device be capable of retaining voltage.

Note that transistors included in the pixel and the memory device that are included in the imaging device each preferably include a metal oxide in a semiconductor layer of the transistor, and the transistor further preferably includes a back gate.

Next, an imaging device of one embodiment of the present invention is described with reference to drawings. FIG. 1 is a diagram illustrating an imaging device 100. The imaging device 100 includes an imaging region 300. The imaging region 300 includes a plurality of pixels. For example, the imaging region 300 illustrated in FIG. 1 includes a pixel P(1,1) to a pixel P(4,4). Note that the number of pixels included in the imaging region 300 is not limited. For example, the imaging region 300 can include the pixel P(1,1) to a pixel P(m,n). Note that m and n are each a positive integer.

In the imaging device 100, the imaging region 300 can be divided into a plurality of regions using the first region as a unit. For example, in the case where the first region is specified using two pixels in the row direction and two pixels in the column direction as units, the first region corresponds to the pixel P(1,1) to the pixel P(2,2) included in a region a11, and the second region corresponds to the pixel P(2,1) to the pixel P(3,2) included in a region a21. The first region preferably includes the same number of pixels as the second region. The pixels P included in the first region or the second region output imaging signals obtained by the pixels P.

Here, the positional relation between the first region and the second region in the imaging region 300 is described. As illustrated in FIG. 1, the pixel P(2,1) and the pixel P(2,2) included in the first region are included in the second region. Note that the pixel P(1,1) and the pixel P(1,2) included in the first region are not included in the second region. In other words, the second region is a region specified by shifting the first region in the x-axis direction by one pixel.

Similarly, a region a31 is a region specified by shifting the second region in the x-axis direction by one pixel, and a region a13 is a region specified by shifting the first region in the y-axis direction by two pixels. Thus, the imaging region 300 can express compressed data in the region a11 to a region a33.

Although not illustrated in FIG. 1, a region a41 is a region specified by shifting the region a31 in the x-axis direction by one pixel. Note that the region a41 needs to be composed of the pixel P(4,1) to a pixel P(5,2). However, the imaging region 300 in the example shown in FIG. 1 does not include the pixels P(5,1) and (5,2). Thus, in the case of specifying the region a41, dummy pixels need to be prepared instead of the pixels P(5,1) and (5,2).

That is, the imaging device 100 can output image data corresponding to the region a11 to the region a33 by performing arithmetic operation on image signals output from the pixel P(1,1) to the pixel P(4,4) in each region. The image data corresponding to the region a11 to the region a33 are output as image data d11 to image data d33. Note that the arithmetic operation includes addition, subtraction, multiplication, division, averaging processing that is combination thereof, or the like.

FIG. 2A to FIG. 2D are diagrams illustrating the imaging region 300. For example, the imaging region 300 includes the pixel P(1,1) to a pixel P(8,9). In FIG. 2A to FIG. 2D, the first region is composed of four pixels (the region is specified using two pixels in the row direction and two pixels in the column direction as units, and is sometimes referred to as a lattice size). Thus, phase image data IM1 to phase image data IM4, which have four different phases and use the pixel P(1,1) to the pixel P(2,2) included in the first region as base points, can be generated. The phase image data IM1 to the phase image data IM4 are generated by arithmetic operation using image data output from the pixels included in regions including the same number of pixels.

The phase image data IM1 to the phase image data IM4 are described in detail. The phase image data IM1 illustrated in FIG. 2A includes a region a111 to a region a144 and includes image data d111 to image data d144. The phase image data IM2 illustrated in FIG. 2B includes a region a211 to a region a244 and includes image data d211 to image data d244. The phase image data IM3 illustrated in FIG. 2C includes a region a311 to a region a344 and includes image data d311 to image data d344. The phase image data IM4 illustrated in FIG. 2D includes a region a411 to a region a444 and includes image data d411 to image data d444.

Figure 2A:
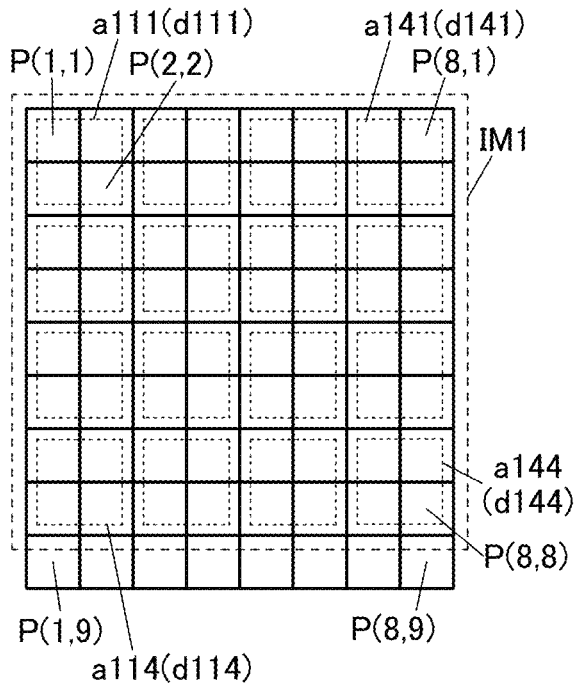
FIG. 2A to FIG. 2D are diagrams illustrating an imaging region.
Figure 2B:
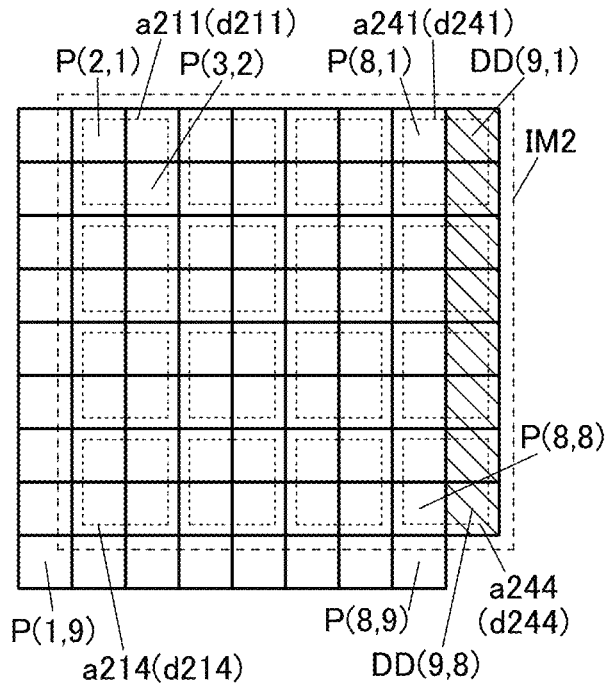
Figure 2C:
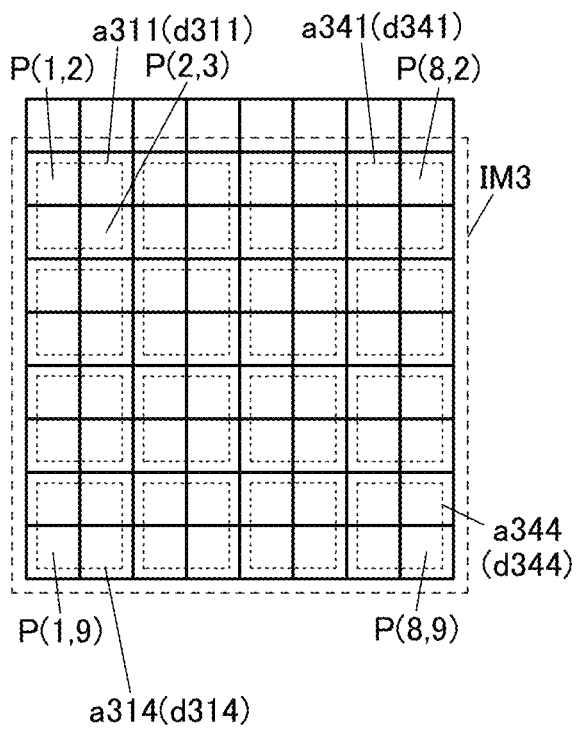

For example, the phase image data IM2 illustrated in FIG. 2B is set using, as a base point, a pixel shifted in the x-axis direction by one pixel from a region specified by the phase image data IM1. The phase image data IM3 illustrated in FIG. 2C is set using, as a base point, a pixel shifted in the y-axis direction by one pixel from a region specified by the phase image data IM1. The phase image data IM3 illustrated in FIG. 2D is set using, as a base point, a pixel shifted in the x-axis direction by one pixel and shifted in the y-axis direction by one pixel from a region specified by the phase image data IM1.

Note that in the example of the phase image data IM2 shown in FIG. 2B, instead of pixels that do not exist in the imaging region 300, a pixel DD(9,1) to a pixel DD(9,8) are added as dummy pixels in the region a241, the region a242, the region a243, and the region a244.

Figure 2D:
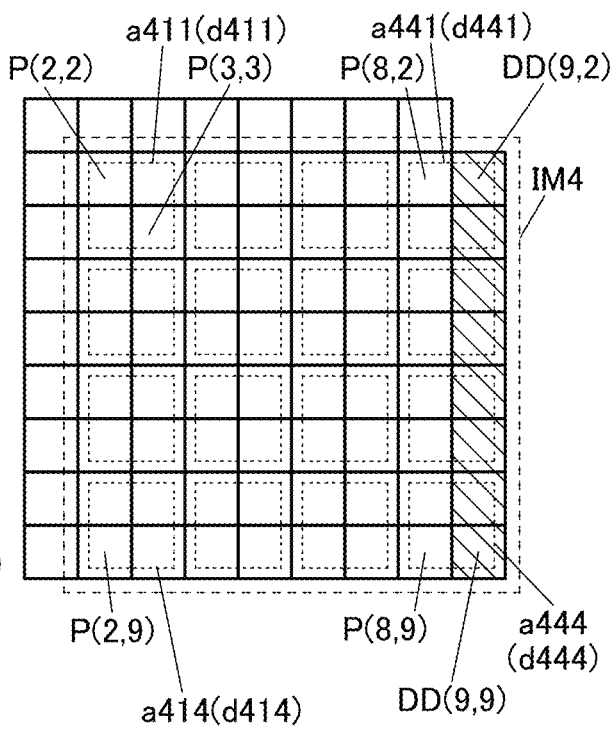

In the example of the phase image data IM4 shown in FIG. 2D, instead of pixels that do not exist in the imaging region 300, the pixel DD(9,2) to the pixel DD(9,9) are added as dummy pixels in the region a441, the region a442, the region a443, and the region a444.

Note that the above-described processing for equalizing the number of pieces of data in arithmetic operation by adding a dummy pixel that does not exist in an actual pixel region is sometimes referred to as padding processing.

Figure 3A:
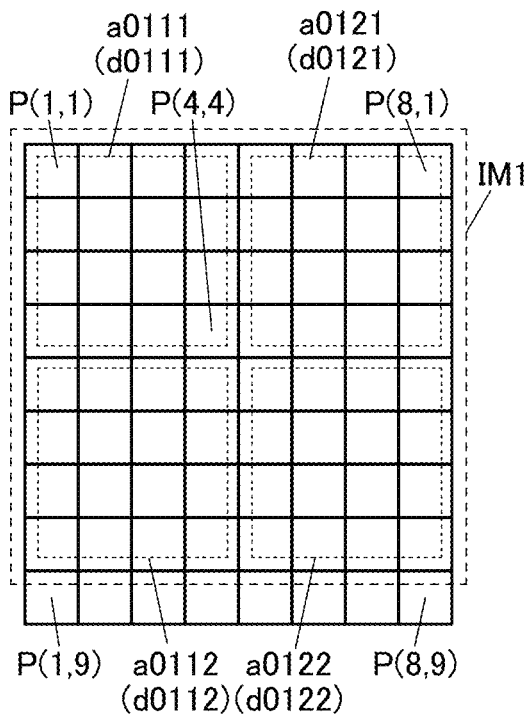
FIG. 3A to FIG. 3C are diagrams illustrating an imaging region.
Figure 3B:
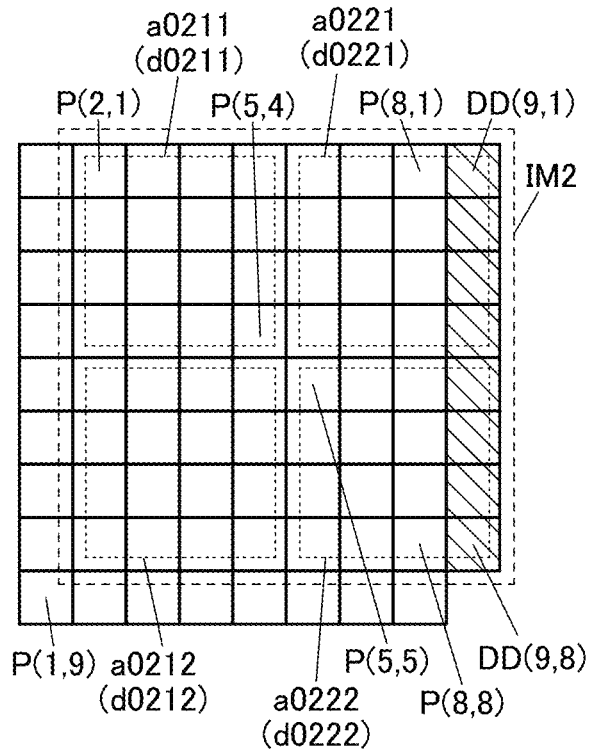
Figure 3C:
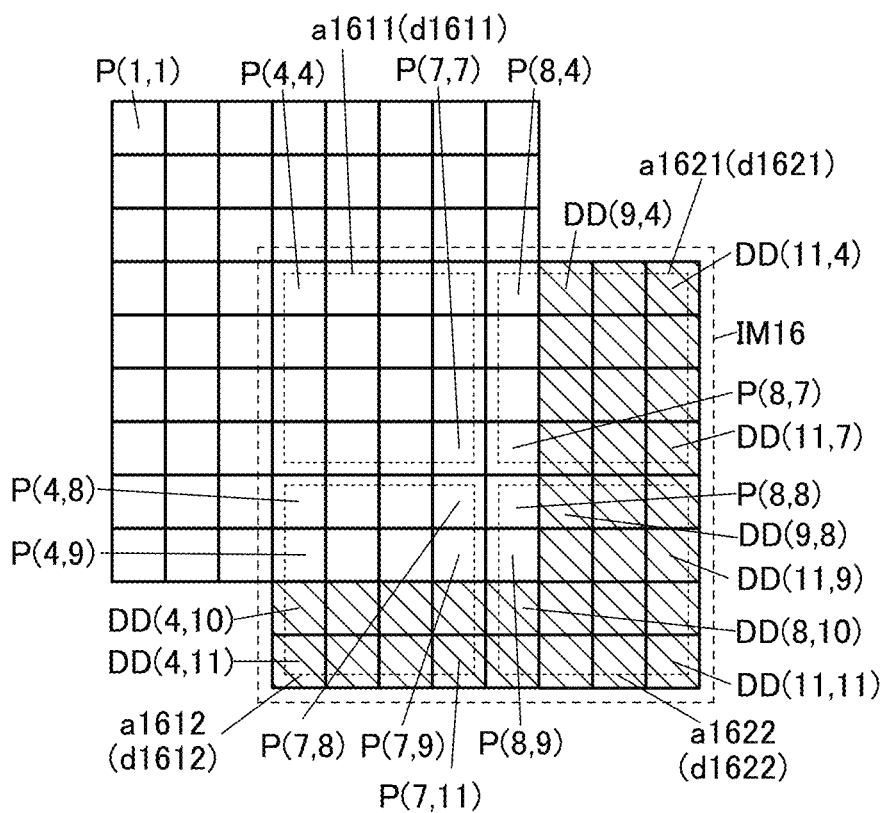

FIG. 3A to FIG. 3C are diagrams illustrating the imaging region 300. As in FIG. 2, the imaging region 300 includes the pixel P(1,1) to the pixel P(8,9). Note that in FIG. 3A to FIG. 3C, the first region is composed of 16 pixels (the lattice size: 4×4). Thus, the phase image data IM1 to phase image data IM16, which have 16 different phases and use the pixel P(1,1) to the pixel P(4,4) included in the first region as base points, can be generated. The phase image data IM1 to the phase image data IM16 are generated by arithmetic operation using image data output from the pixels included in regions including the same number of pixels. In FIG. 3, the phase image data IM1, the phase image data IM2, and the phase image data IM16 are described, and the description of the others is omitted.

The phase image data IM1, the phase image data IM2, and the phase image data IM16 are described in detail. The phase image data IM1 illustrated in FIG. 3A includes a region a0111 to a region a0122 and includes image data d0111 to image data d0122. The phase image data IM2 illustrated in FIG. 3B includes a region a0211 to a region a0222 and includes image data d0211 to image data d0222. The phase image data IM16 illustrated in FIG. 3C includes a region a1611 to a region a1622 and includes image data d1611 to image data d1622.

For example, the phase image data IM2 illustrated in FIG. 3B is set using, as a base point, a pixel shifted in the x-axis direction by one pixel from a region used as a base point of the phase image data IM1. The phase image data IM16 illustrated in FIG. 3C is set using, as a base point, a pixel shifted in the x-axis direction by three pixels and shifted in the y-axis direction by three pixels from a region used as a base point of the phase image data IM1.

Note that in the example of the phase image data IM2 shown in FIG. 3B, instead of pixels that do not exist in the imaging region 300, the pixel DD(9,1) to the pixel DD(9,8) are added as dummy pixels in the region a0221 and the region a0222.

Note that in the example of the phase image data IM16 shown in FIG. 3C, instead of pixels that do not exist in the imaging region 300, the dummy pixel DD(9,4) to a dummy pixel DD(11,9) in the x-axis direction and a dummy pixel DD(4,10) to a pixel dummy DD(11,11) in the y-axis direction are specified in the region a1621, the region a1612, and the region a1622.

Here, an example of the phase image data IM16 will be described in detail. The region a1611 is composed of the pixel P(4,4) to the pixel P(7,7). The region a1621 is composed of the pixel P(8,4) to the pixel P(8,7) and the dummy pixel DD(9,4) to the pixel dummy DD(11,7). The region a1612 is composed of the pixel P(4,8) to the pixel P(7,9) and the dummy pixel DD(4,10) to the pixel dummy DD(7,11). The region a1622 is composed of the pixel P(8,8) and the pixel P(8,9), the dummy pixel DD(9,8) to the pixel dummy DD(11,9), and the dummy pixel DD(8,10) to the pixel dummy DD(11,11). Note that a dummy signal supplied to the dummy pixel is preferably changed as needed.

Figure 4:
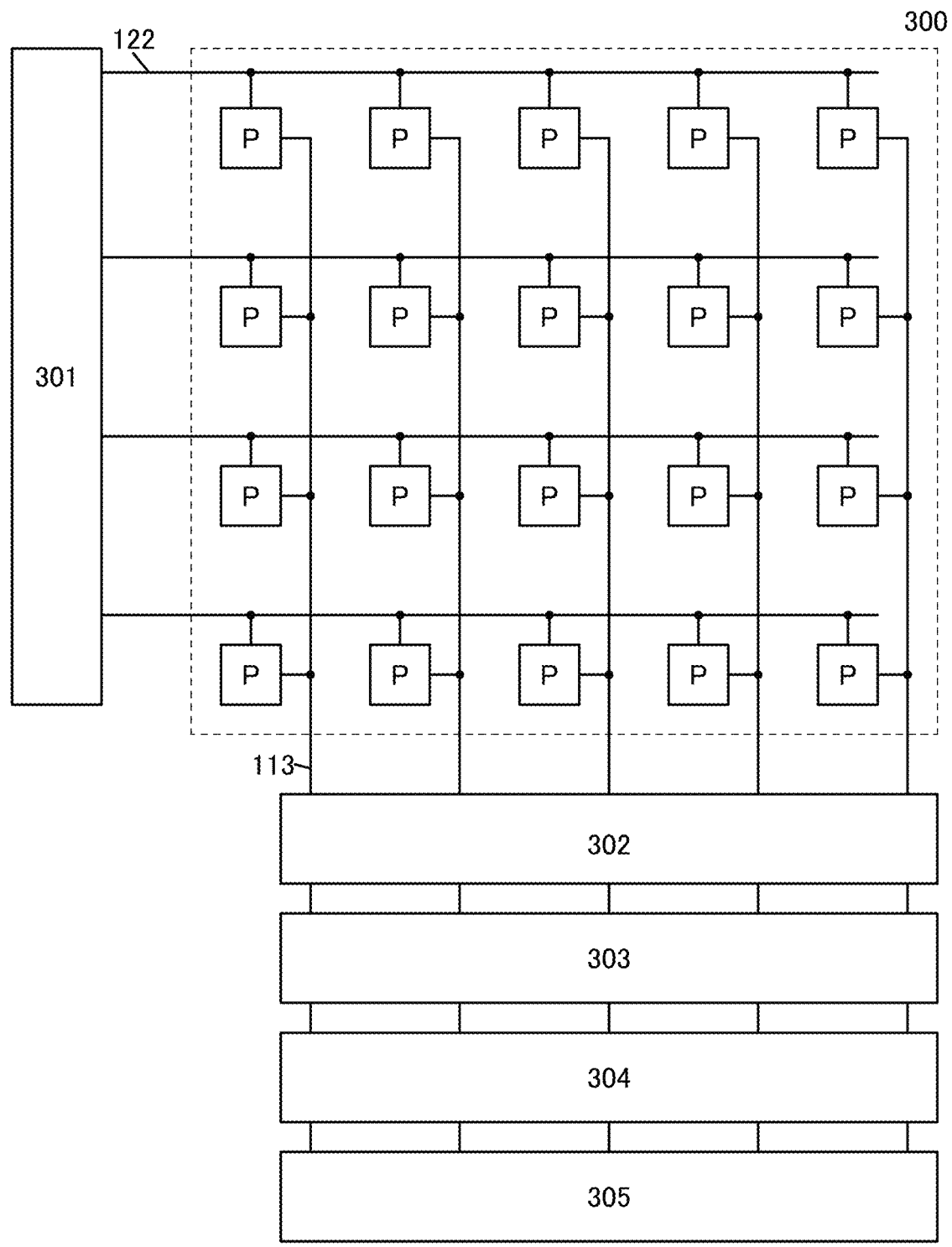
FIG. 4 is a diagram illustrating an imaging device.

FIG. 4 is a diagram illustrating the imaging device 100. The imaging device 100 includes the imaging region 300, a circuit 301, a circuit 302, a circuit 303, a circuit 304, and a circuit 305. The imaging region 300 includes the plurality of pixels P.

The circuit 301 functions as a reading selection driver. For example, the circuit 301 is electrically connected to the plurality of pixels P through wirings 122. The pixels P are electrically connected to the circuit 302 through wirings 113. The circuit 302 is electrically connected to the circuit 303. The circuit 303 is electrically connected to the circuit 304. The circuit 304 is electrically connected to the circuit 305.

The circuit 302 functions as a switch module. The circuit 303 has a function of converting an imaging signal output from the pixel as a current into a potential. The circuit 304 functions as a correlated double sampling circuit (CDS circuit). The circuit 305 functions as a memory device.

The circuit 301 can select, from the pixels P, a pixel from which an imaging signal is read by supplying a selection signal to the wiring 122. Furthermore, the circuit 301 can supply selection signals to the plurality of wirings 122 at the same time. By supplying selection signals to the plurality of wirings 122 at the same time, imaging signals can be concurrently read from a pixel group selected by the above-described lattice size.

The circuit 302 is a switch module for switching reading paths in order to handle the pixel group selected by the lattice size as one region. Thus, the circuit 302 can perform arithmetic operation on imaging signals output from the pixel group and generate image data. Note that the arithmetic operation is preferably accumulation. In the case where a region selected by the lattice size includes a dummy pixel, a padding circuit included in the circuit 302 can supply dummy data instead of an insufficient pixel.

The circuit 303 converts the image data output as a current into a potential. The image data converted into a potential corresponds to the accumulation result of the imaging signals output from the plurality of pixels.

The circuit 304 is a CDS circuit for eliminating a variation, an offset component, or the like of the imaging device 100 in order to generate phase image data. Specifically, the circuit 304 generates image data from which a variation, an offset component, or the like due to parasitic capacitance, a resistance component, or the like of each of the wirings, the pixel, the circuit 302, the circuit 303, or the like is eliminated. An output of the circuit 304 is stored in the circuit 305. Note that the circuit 305 is preferably an analog memory capable of retaining a potential value. The analog memory will be described in detail with reference to FIG. 12.

Figure 5A:
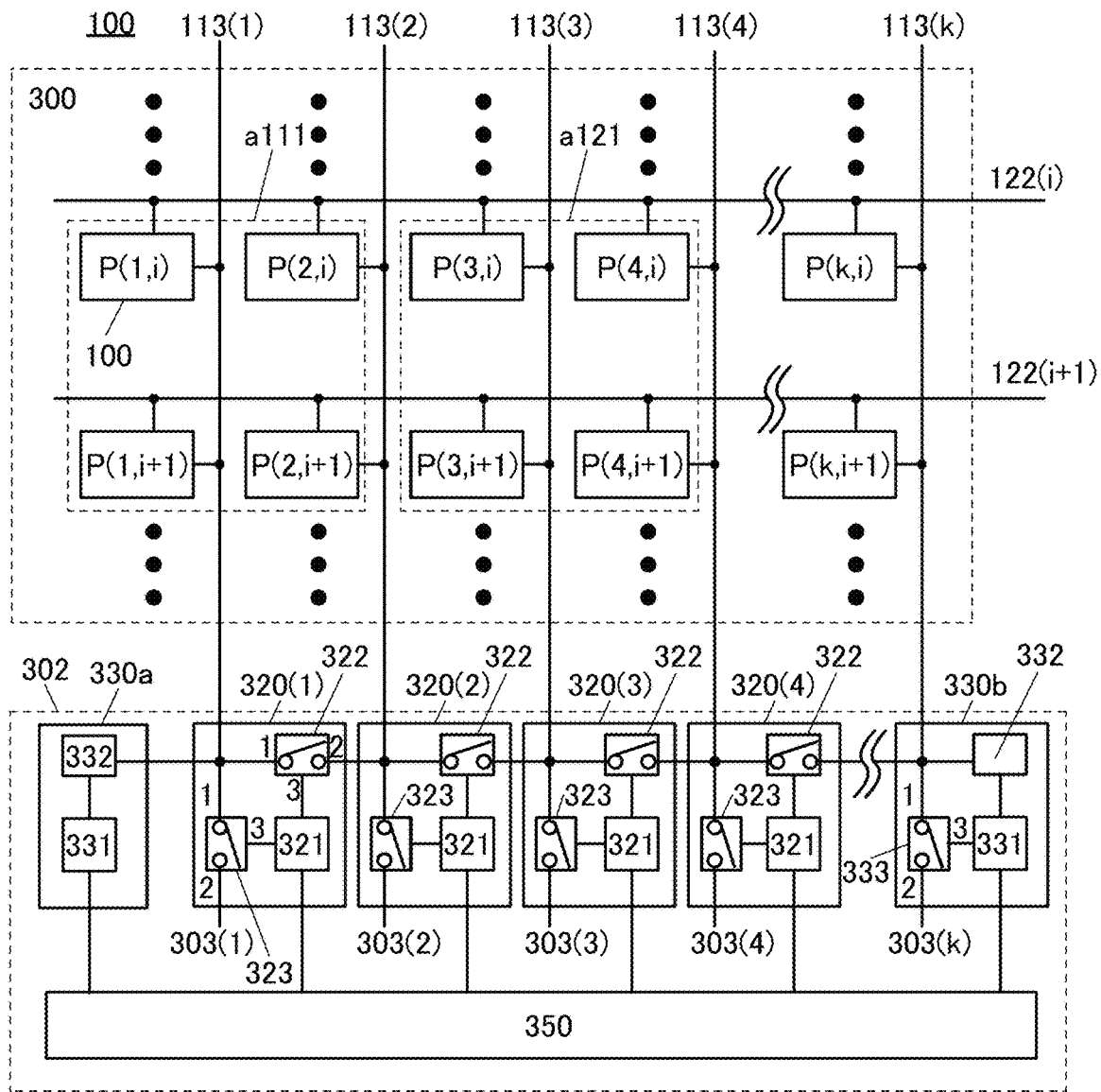
FIG. 5A is a diagram illustrating an imaging device.

FIG. 5A is a diagram illustrating the imaging device 100. To simplify the description, portions having similar functions are denoted by the same reference numerals, and description thereof is not repeated.

FIG. 5A is a diagram specifically illustrating the imaging region 300 and the circuit 302 included in the imaging device 100. The imaging region 300 includes the plurality of pixels P, a wiring 113(1) to a wiring 113($k$), and a wiring 122($i$) to a wiring 122($i$+1). For example, the imaging region 300 includes a pixel P(1,$i$) to a pixel P(k,i+1). Note that i and k are each a positive integer.

The circuit 302 includes a plurality of circuits 320, a circuit 330$a$, a circuit 330$b$, and a circuit 350. The circuit 320 includes a circuit 321, a switch 322, and a switch 323. Note that k−1 circuits 320 are preferably provided. The circuit 330$a$ includes a circuit 331 and a circuit 332. The circuit 330$b$ includes the circuit 331, the circuit 332, and a switch 333.

The circuit 350 is a control circuit. The circuit 350 controls the switch 322 and the switch 323 through the circuit 321 functioning as a decoder circuit, and controls the switch 333 through the circuit 331 functioning as a decoder circuit. Note that the circuit 330$a$ and the circuit 330$b$ function as padding circuits and can perform padding processing.

Next, electrical connection in the imaging device 100 described with reference to FIG. 5A is described. As an example, the case where the imaging region 300 includes at least the region a111 and the region a121 and the region a111 and the region a121 are each composed of four pixels is described.

The region a111 is composed of the pixel P(1,$i$), the pixel P(2,$i$), the pixel P(1,$i$+1), and the pixel P(2,$i$+1). The wiring 122($i$) is electrically connected to the pixel P(1,$i$) and the pixel P(2,$i$). The wiring 122($i$+1) is electrically connected to the pixel P(1,$i$+1) and the pixel P(2,$i$+1). The wiring 113(1) is electrically connected to the pixel P(1,$i$) and the pixel P(1,$i$+1). The wiring 113(2) is electrically connected to the pixel P(2,$i$) and the pixel P(2,$i$+1).

The region a121 is composed of the pixel P(3,$i$), the pixel P(4,$i$), the pixel P(3,$i$+1), and the pixel P(4,$i$+1). The wiring 122($i$) is electrically connected to the pixel P(3,$i$) and the pixel P(4,$i$). The wiring 122($i$+1) is electrically connected to the pixel P(3,$i$+1) and the pixel P(4,$i$+1). A wiring 113(3) is electrically connected to the pixel P(3,$i$) and the pixel P(3,$i$+1). The wiring 113(4) is electrically connected to the pixel P(4,$i$) and the pixel P(4,$i$+1).

The wiring 122($i$) is electrically connected to a pixel P(k,i). The wiring 122($i$+1) is electrically connected to the pixel P(k,i+1). The wiring 113($k$) is electrically connected to the pixel P(k,i) and the pixel P(k,i+1).

The wiring 113(1) is electrically connected to the circuit 332 included in the circuit 330$a$, and a terminal 1 of the switch 322 and a terminal 1 of the switch 323 included in a circuit 320(1). A terminal 2 of the switch 322 included in the circuit 320(1) is electrically connected to the wiring 113(2), and a terminal 1 of the switch 322 and a terminal 1 of the switch 323 included in a circuit 320(2). A terminal 2 of the switch 323 included in the circuit 320(1) is electrically connected to a circuit 303(1).

A terminal 2 of the switch 323 included in the circuit 320(2) is electrically connected to a circuit 303(2). A terminal 2 of the switch 322 included in the circuit 320(2) is electrically connected to the wiring 113(3), and a terminal 1 of the switch 322 and a terminal 1 of the switch 323 included in a circuit 320(3).

A terminal 2 of the switch 323 included in the circuit 320(3) is electrically connected to a circuit 303(3). A terminal 2 of the switch 322 included in the circuit 320(3) is electrically connected to the wiring 113(4), and a terminal 1 of the switch 322 and a terminal 1 of the switch 323 included in a circuit 320(4).

A terminal 2 of the switch 323 included in the circuit 320(4) is electrically connected to a circuit 303(4). A terminal 2 of the switch 322 included in the circuit 320(4) is electrically connected to the wiring 113(5) (not illustrated), and a terminal 1 of the switch 322 and a terminal 1 of the switch 323 included in a circuit 320(5) (not illustrated).

Next, the circuit 330$b$ is described. The circuit 330$b$ is electrically connected to the wiring 113($k$). The wiring 113($k$) is electrically connected to a terminal 2 of the switch 322 included in a circuit 320($k$−1) (not illustrated), and the circuit 332 and a terminal 1 of the switch 333 included in the circuit 330$b$. A terminal 2 of the switch 333 is electrically connected to a circuit 303($k$).

Next, the circuit 350 is described. The circuit 350 is electrically connected to the circuit 332 through the circuit 331 included in the circuit 330$a$. The circuit 350 is electrically connected to, through the circuit 331 included in the circuit 330b, the circuit 332 and a terminal 3 of the switch 333 included in the circuit 330b. The circuit 350 is electrically connected to, through the circuit 321 included in the circuit 320(1), a terminal 3 of the switch 322 and a terminal 3 of the switch 323 included in the circuit 320(1). The circuit 350 is electrically connected to, through the circuit 321 included in the circuit 320(2), a terminal 3 of the switch 322 and a terminal 3 of the switch 323 included in the circuit 320(2). The circuit 350 is electrically connected to, through the circuit 321 included in the circuit 320(3), a terminal 3 of the switch 322 and a terminal 3 of the switch 323 included in the circuit 320(3). The circuit 350 is electrically connected to, through the circuit 321 included in the circuit 320(4), a terminal 3 of the switch 322 and a terminal 3 of the switch 323 included in the circuit 320(4).

For example, the wiring 113(1) can be electrically connected to the wiring 113(2) by turning on the switch 322 included in the circuit 320(1). Furthermore, in the case where the switch 323 included in the circuit 320(1) is turned on and the switch 322 and the switch 323 included in the circuit 320(2) are turned off, imaging signals output from the pixel P(1,i), the pixel P(2,i), the pixel P(1,i+1), and the pixel P(2,i+1) are supplied to the circuit 303(1). Thus, image data output from the region a111 is generated by adding the imaging signals output from the pixel P(1,i), the pixel P(2,i), the pixel P(1,i+1), and the pixel P(2,i+1) together.

In the case where a region including a dummy pixel is provided to include a pixel connected to the wiring 113(1), for example, the circuit 330a functions as a padding circuit. The circuit 330a operates instead of the dummy pixel. Image data of the region including dummy data is output to the circuit 303(1). Similarly, in the case where a region including a dummy pixel is provided to include a pixel connected to the wiring 113(k), the circuit 330b functions as a padding circuit. The circuit 330b operates instead of the dummy pixel. Image data of the region including dummy data is output to the circuit 303(k) through the switch 333.

Figure 5B:
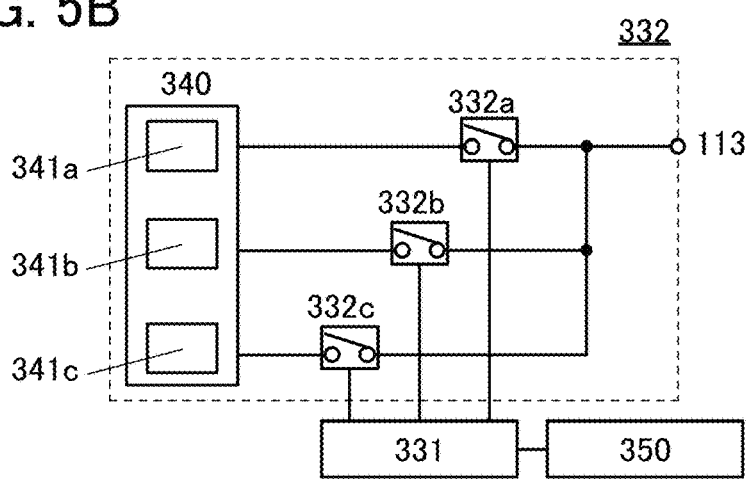
FIG. 5B is a diagram illustrating a circuit 332.

FIG. 5B is a diagram illustrating the circuit 332 functioning as a padding circuit. The circuit 332 includes a register 340 and a plurality of switches. The register 340 includes a memory 341a to a memory 341c and includes switches 332a to 332c corresponding the respective memories.

The memory 341a is electrically connected to the wiring 113 through the switch 332a. The memory 341b is electrically connected to the wiring 113 through the switch 332b. The memory 341c is electrically connected to the wiring 113 through the switch 332c. Note that the on state and the off state of each of the switch 332a to the switch 332c are independently controlled by the circuit 331. The operation of the circuit 331 is preferably controlled by an instruction from the circuit 350.

The memory 341a to the memory 341c are preferably analog memories. As dummy data, a given potential stored in the analog memory can be used. Thus, the memory included in the register 340 corresponds to a dummy pixel. Accordingly, the number of memories included in the register 340 is not limited. Each memory preferably stores, for example, a potential corresponding to an intermediate value of an imaging signal as dummy data. The dummy data are preferably supplied from the memories whose number is the same as that of pixels added as dummy pixels.

Note that transistors can be used as the switch 322, the switch 323, the switch 333, and the switch 332a to the switch 332c. Moreover, a transistor is used as a selection switch of the analog memory. Furthermore, transistors are used as a plurality of switches included in the pixel P.

A semiconductor layer included in the above-described transistor preferably includes an oxide semiconductor. A transistor including an oxide semiconductor (OS), which is one kind of metal oxide, in a semiconductor layer where a channel of the transistor is formed is also referred to as an "OS transistor" or "OS-FET"). It is known that an OS transistor has a small change in electrical characteristics caused by temperature change. Furthermore, in an OS transistor, a semiconductor layer has a large energy gap, and thus the OS transistor can have an extremely low off-state current of several yA/µm (a current value per micrometer of a channel width). Therefore, an OS transistor is preferably used for a memory device. The OS transistor will be described in detail in Embodiment 3.

The off-state current of an OS transistor hardly increases even in a high temperature environment. Specifically, the off-state current hardly increases even at an environment temperature higher than or equal to room temperature and lower than or equal to 200° C. In addition, the on-state current is unlikely to decrease even in high-temperature environments. An OS transistor has high withstand voltage between its source and drain. When OS transistors are used as transistors included in a semiconductor device, the semiconductor device achieves stable operation and high reliability even in a high-temperature environment.

An OS transistor can be formed by a sputtering method in a BEOL (Back end of line) process for forming a wiring of a semiconductor device. Thus, one imaging device 100 can be formed using transistors having different transistor characteristics. In other words, the use of an OS transistor facilitates formation of an SOC (System on chip).

Figure 6:
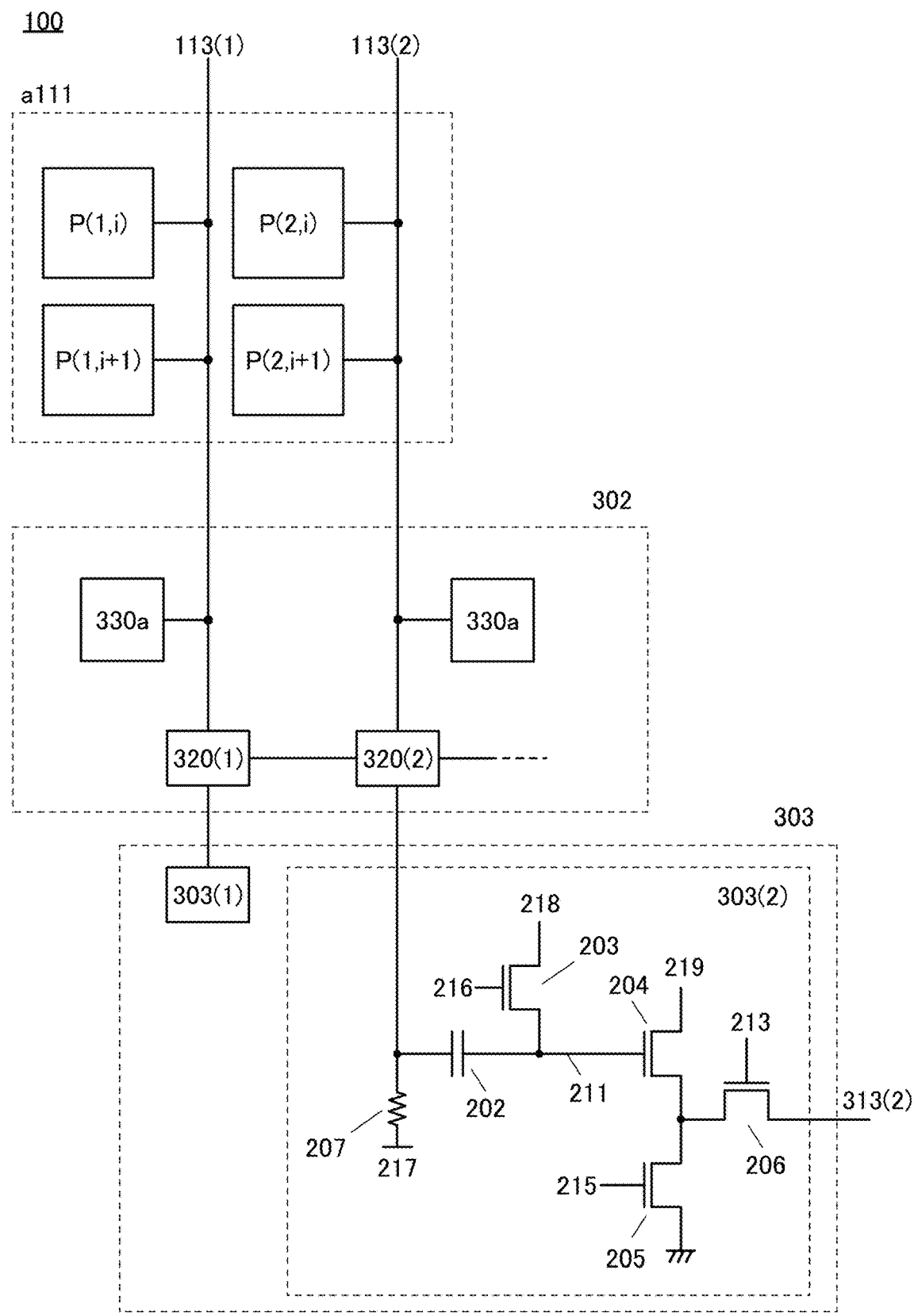
FIG. 6 is a diagram illustrating an imaging device.

FIG. 6 is a diagram illustrating the imaging device 100. FIG. 6 illustrates the region a111, the circuit 302, and the circuit 303 included in the imaging device 100. To simplify the description, portions having similar functions are denoted by the same reference numerals, and description thereof is not repeated.

In FIG. 6, description is made using the pixel P(1,i) to the pixel P(2,i+1) included in the region a111 as an example.

To the wiring 113(1), the pixel P(1,i) and the pixel P(1,i+1) are electrically connected. The wiring 113(1) is electrically connected to the circuit 320(1) included in the circuit 302. The circuit 320(1) is electrically connected to the circuit 303(1) included in the circuit 303.

To the wiring 113(2), the pixel P(2,i) and the pixel P(2,i+1) are electrically connected. The wiring 113(2) is electrically connected to the circuit 320(2) included in the circuit 302. The circuit 320(2) is electrically connected to the circuit 303(2) included in the circuit 303.

Note that the circuit 320(1) can be electrically connected to the circuit 320(2) by control of the circuit 350. Although not illustrated, the circuit 320(1) can also be connected to the circuit 320(k). Furthermore, FIG. 6 is different from FIG. 5A in that the circuits 330a are electrically connected to the wirings 113. The circuit 330a connected to the wiring 113 is set in the case where a dummy pixel is provided in the y-axis direction of the imaging region 300. By providing the circuit 330a for each wiring 113, dummy data can be supplied in the case where a dummy pixel is provided.

Next, the circuit 303 will be described in detail. Here, description is made using the circuit 303(2) as an example. The circuit 303(2) includes a capacitor 202, a transistor 203, a transistor 204, a transistor 205, a transistor 206, and a resistor 207.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the other electrode of the capacitor 202.

The other electrode of the capacitor 202 is electrically connected to the wiring 113 through the circuit 320. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 313. The other electrode of the resistor 207 is electrically connected to a wiring 217. A gate of the transistor 203 is electrically connected to a wiring 216. A gate of the transistor 205 is electrically connected to a wiring 215. A gate of the transistor 206 is electrically connected to a wiring 213.

The wiring 217, the wiring 218, and the wiring 219 can each have a function of a power supply line. For example, the wiring 218 can have a function of a wiring which supplies a potential dedicated to reading. The wiring 217 and the wiring 219 can function as high potential power supply lines. The wiring 213, the wiring 215, and the wiring 216 can function as signal lines for controlling the electrical conduction of the respective transistors. The wiring 313(2) is an output line and can be electrically connected to the circuit 304 illustrated in FIG. 4, for example.

The transistor 203 can have a function of resetting the potential of the wiring 211 to the potential of the wiring 218. The transistor 204 and the transistor 205 can have a function of source follower circuits. The transistor 206 can have a function of controlling a reading operation. The wiring 211 is a wiring for electrically connecting the one electrode of the capacitor 202, the one of the source and the drain of the transistor 203, and the gate of the transistor 204.

Note that a capacitor may be used instead of the resistor 207. The use of the capacitor enables current-voltage conversion while leakage current is inhibited and power consumption is reduced. In addition, when the capacitor is used, the capacitor 202 can be omitted from the components. When the capacitor is used, the pixel P illustrated in FIG. 7B or FIG. 7C described later is preferably used.

Figure 7A:
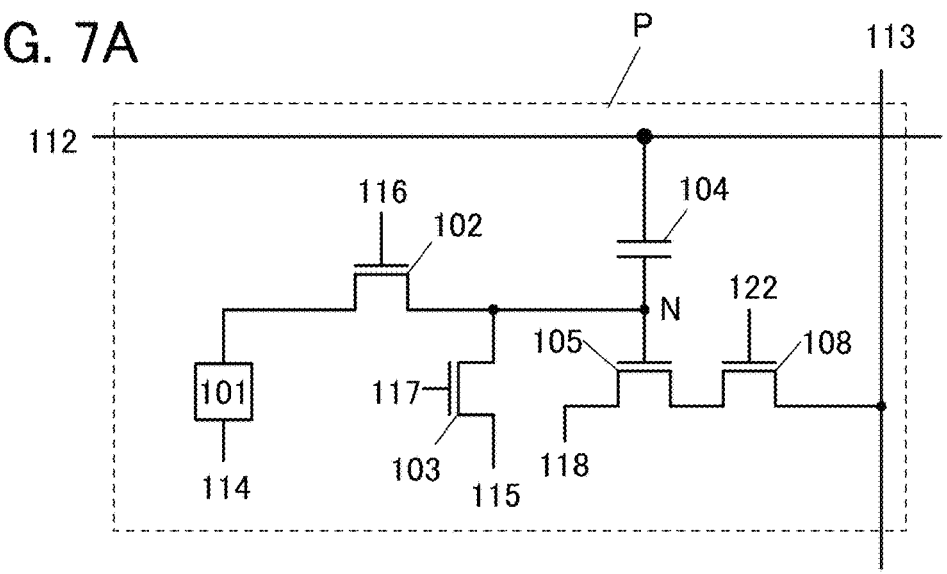
FIG. 7A to FIG. 7C are diagrams illustrating pixels.
Figure 7B:
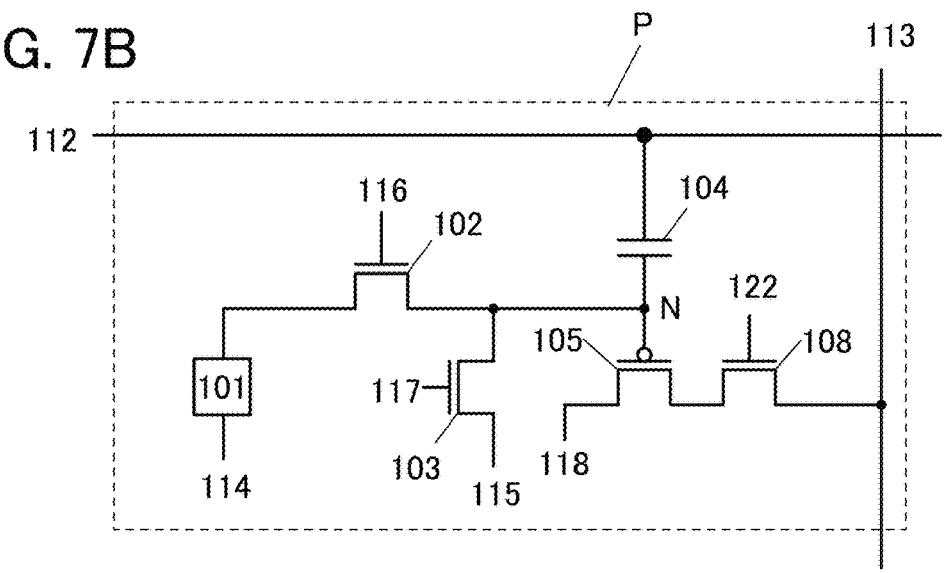
Figure 7C:
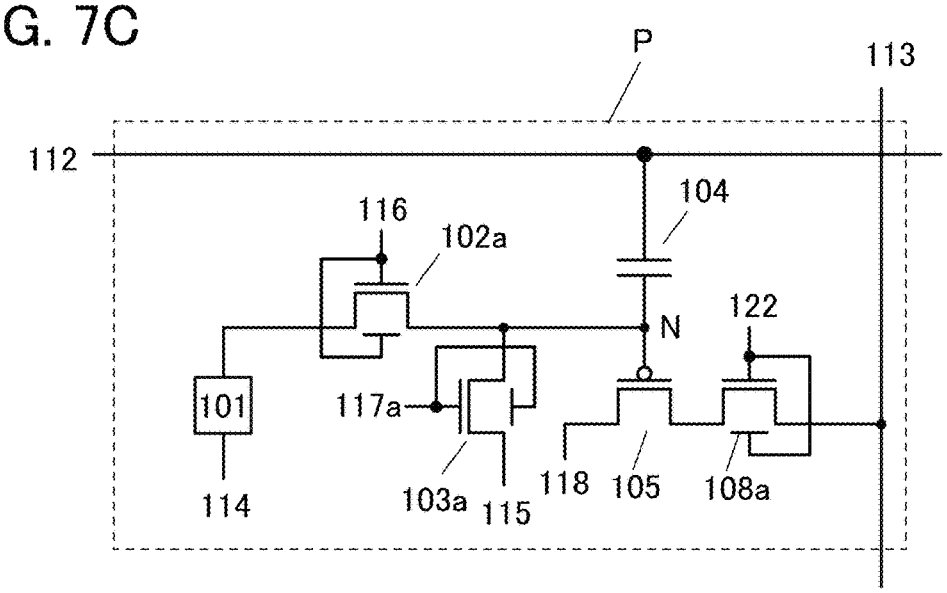

FIG. 7A to FIG. 7C are diagrams illustrating the pixel P. As illustrated in FIG. 7A, the pixel P can include a photoelectric conversion device 101, a transistor 102, a transistor 103, a capacitor 104, a transistor 105, and a transistor 108.

One electrode of the photoelectric conversion device 101 is electrically connected to one of a source and a drain of the transistor 102. The other of the source and the drain of the transistor 102 is electrically connected to one of a source and a drain of the transistor 103. The one of the source and the drain of the transistor 103 is electrically connected to one electrode of the capacitor 104. The one electrode of the capacitor 104 is electrically connected to a gate of the transistor 105. One of a source and a drain of the transistor 105 is electrically connected to one of a source and a drain of the transistor 108. The other electrode of the capacitor 104 is electrically connected to a wiring 112.

The other electrode of the photoelectric conversion device 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. The other of the source and the drain of the transistor 105 is electrically connected to a wiring 118. The other of the source and the drain of the transistor 108 is electrically connected to the wiring 113. A gate of the transistor 108 is electrically connected to the wiring 122.

Here, an electrical connection point (a wiring) of the other of the source and the drain of the transistor 102, the one of the source and the drain of the transistor 103, the one electrode of the capacitor 104, and the gate of the transistor 105 is referred to a node N.

The wiring 114 and the wiring 115 can each have a function of a power supply line. For example, the wiring 114 can function as a high potential power supply line, and the wiring 115 can function as a low potential power supply line. The wiring 116, the wiring 117, and the wiring 122 can function as a signal line for controlling the on/off of each transistor. The wiring 112 can function as a wiring for supplying a potential corresponding to a weight coefficient to the pixel P. The wiring 113 can function as a wiring which electrically connects the pixel P and the circuit 303.

Note that an amplifier circuit or a gain control circuit may be electrically connected to the wiring 113.

As the photoelectric conversion device 101, a photodiode can be used. In order to increase the light detection sensitivity under low illuminance conditions, an avalanche photodiode is preferably used.

The transistor 102 can have a function of controlling the potential of the node N. The transistor 103 can have a function of initializing the potential of the node N. The transistor 105 can have a function of controlling a current to be supplied to the circuit 303 in accordance with the potential of the node N. The transistor 108 can have a function of selecting a pixel. Note that the transistor 108 may be provided between the wiring 118 and the transistor 105.

As an example, the case where the wiring 112 is electrically connected to all the pixels P included in the imaging region 300 is described. As a potential to be supplied to the wiring 112, a potential corresponding to a weight coefficient can be supplied to the node N through the capacitor 104. In the case where imaging signals in the regions divided into a lattice pattern, which are one embodiment of the present invention, are processed at the same time, weight coefficients can be supplied to target pixels at the same time.

In FIG. 7A, the transistor 105 is preferably an n-channel FET. In the case where the transistor 105 is an n-channel FET, the wiring 118 functions as a low potential power supply line. When the wiring 118 functions as a low potential power supply line, a potential between the gate and the source of the transistor 105 is determined by the node N. Accordingly, in the pixel P, current flows from the wiring 113 to the direction of the wiring 118 through the transistor 105. Note that the transistor 102, the transistor 103, or the transistor 108 can be either an n-channel FET or a p-channel FET.

In FIG. 7B, the transistor 105 is preferably a p-channel FET. In the case where the transistor 105 is a p-channel FET, the wiring 118 functions as a high potential power supply line. When the wiring 118 functions as a high potential power supply line, a potential between the gate and the source of the transistor 105 is determined by the node N. Accordingly, in the pixel P, current flows from the wiring 118 to the direction of the wiring 113 through the transistor 105. Note that the transistor 102, the transistor 103, or the transistor 108 can be either an n-channel FET or a p-channel FET.

FIG. 7C is a circuit diagram illustrating the pixel P that is different from that in FIG. 7B. FIG. 7C is different from FIG. 7B in that a transistor 102a, a transistor 103a, and a transistor 108a are included. The transistor 102a, the transistor 103a, and the transistor 108a each include a back gate.

As an example, in the case where an avalanche photodiode is used as the photoelectric conversion device 101, a high potential is sometimes applied and thus a transistor with a high withstand voltage is preferably used as a transistor connected to the photoelectric conversion device 101. As the transistor with a high withstand voltage, an OS transistor using a metal oxide in its channel formation region or the like can be used, for example. Specifically, OS transistors are preferably used as the transistor 102 and the transistor 102a. Each of the OS transistors preferably includes a back gate. When each of the OS transistors includes the back gate, the threshold voltages of the OS transistors can be controlled.

The OS transistor also has a feature of an extremely low off-state current. When OS transistors are used as the transistor 102, the transistor 102a, the transistor 103, and the transistor 103a, the charge retention period of the node N can be lengthened greatly. Therefore, a global shutter mode in which a charge accumulation operation is performed in all the pixels at the same time can be used without complicating the circuit structure and operation method. Furthermore, while an imaging signal is retained at the node N, arithmetic operation using the imaging signal can be performed a plurality of times.

OS transistors can be used as the transistor 108 and the transistor 108a. In the pixel P, generation of a variation or a noise component due to leakage current to the wiring 113 can be suppressed by utilizing the feature of an extremely low off-state current of the OS transistor.

Meanwhile, it is desired that the transistor 105 have excellent amplifying characteristics. Accordingly, a transistor using silicon in its channel formation region (hereinafter, a Si transistor) is preferably used as the transistor 105.

Note that without limitation to the above, an OS transistor and a Si transistor may be used in combination. Alternatively, all the transistors may be OS transistors. Alternatively, all the transistors may be Si transistors.

The potential of the node N in the pixel P is determined by capacitive coupling between a potential (an imaging signal) obtained by adding a reset potential supplied from the wiring 115 and a potential generated by photoelectric conversion by the photoelectric conversion device 101 and the potential corresponding to a weight coefficient supplied from the wiring 112. That is, a current corresponding to a potential in which a predetermined weight coefficient is added to the imaging signal flows through the transistor 105.

Figure 8:
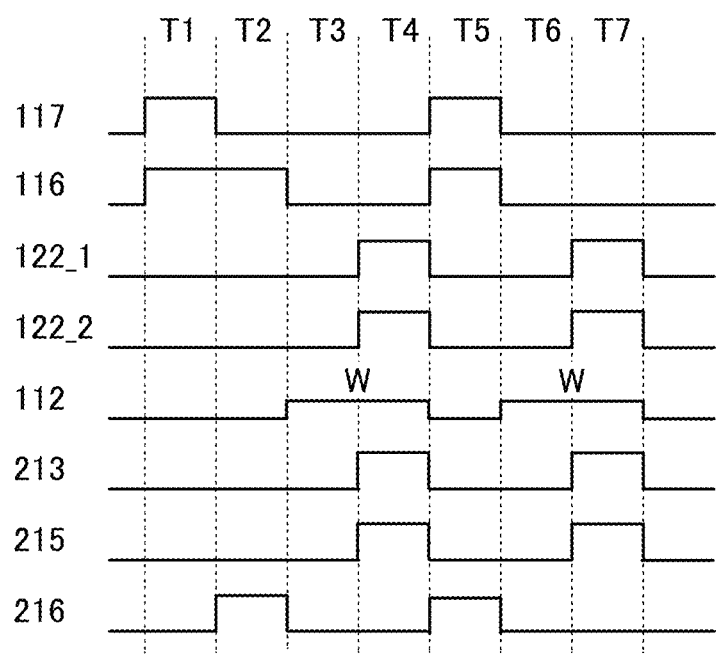
FIG. 8 is a timing chart illustrating operation of an imaging device.

FIG. 8 is a timing chart illustrating operation in the region a111 and the circuit 303 of obtaining data obtained when imaging is performed and data obtained when imaging is not performed. For convenience, the timings when signals change are matched in the chart; however, the timings inside the circuit can be compressed in actual operation. In addition, the timings can be shifted in consideration of the delay inside the circuit.

First, obtainment of data obtained when imaging is performed is described. Note that in the following description, a high potential is represented by "H" and a low potential is represented by "L".

First, in Period T1, the potential of the wiring 117 is set to "H" and the potential of the wiring 116 is set to "H", so that the nodes N in the pixels P have reset potentials. The potential of the wiring 112 is set to "L", so that a weight coefficient is initialized.

In Period T2, the potential of the wiring 116 is kept at "H". The potential of the wiring 117 is set to "L", so that a potential X (an imaging signal) is updated at each of the nodes N by a current generated by photoelectric conversion by the photoelectric conversion device 101. The wiring 216 is set to "H", so that a potential Vr of the wiring 218 is written to the wiring 211. The operation in Periods T1 and T2 corresponds to obtainment of the data obtained when imaging is performed, and the data is represented as the potential Vr of the wiring 211.

In Period T3, a potential corresponding to a weight coefficient W is supplied to the wiring 112. The weight coefficient W is added to, through the capacitor 104, the node N in each of the pixels P in the imaging region 300 (in the first row and the second row).

In Period T4, the potentials of a wiring 122_1 and a wiring 122_2 are set to "H", so that all the pixels P in the region a111 are selected. At this time, a current corresponding to a potential W+X flows to the transistors 105 in the pixels P in the first row and the second row. Here, a potential is generated by a current flowing to the resistor 207 through the wiring 113. A potential Y generated by the current flowing to the resistor 207 is added to the potential Vr of the wiring 211 through the capacitor 202. Accordingly, the potential of the wiring 211 becomes "Vr+Y". Here, given that Vr=0, Y is the difference itself, which means that the data obtained when imaging is performed is calculated. Furthermore, the wiring 213 and the wiring 215 are set to "H", so that the circuit 303 can output a signal potential corresponding to the data obtained when imaging is performed of the region a111 by a source follower operation.

Next, obtainment of the data obtained when imaging is not performed will be described.

In Period T5, the potential of the wiring 117 is set to "H" and the potential of the wiring 116 is set to "H", so that the nodes N in the pixels P have reset potentials. The potential of the wiring 112 is set to "L", so that a weight coefficient is initialized. The wiring 216 is set to "H", so that the potential Vr of the wiring 218 is written to the wiring 211.

In Period T6, a potential corresponding to the weight coefficient W is supplied to the wiring 112. The weight coefficient W is added to, through the capacitor 104, the node N in each of the pixels P in the imaging region 300 (in the first row and the second row).

In Period T7, the potentials of the wiring 122_1 and the wiring 122_2 are set to "H", so that all the pixels P in the region a111 are selected. At this time, a current corresponding to the potential W+X flows to the transistors 105 in the pixels P in the first row and the second row. Here, a potential is generated by a current flowing to the resistor 207 through the wiring 113. A potential Y generated by the current flowing to the resistor 207 is added to the potential Vr of the wiring 211 through the capacitor 202. Accordingly, the potential of the wiring 211 becomes "Vr+Y". Here, given that Vr=0, Y is the difference itself, which means that the data obtained when imaging is not performed is calculated. Furthermore, the wiring 213 and the wiring 215 are set to "H", so that the circuit 303 can output a signal potential corresponding to the data obtained when imaging is not performed of the region a111 by a source follower operation.

Note that the data obtained when imaging is not performed includes a circuit variation or an unnecessary offset component.

The data obtained when imaging is performed and the data obtained when imaging is not performed output from the circuit 303 in the above operation are input to the circuit 304. Arithmetic operation for obtaining the difference between the data obtained when imaging is performed and the data obtained when imaging is not performed is performed in the circuit 304, so that an unnecessary offset component can be eliminated.

Figure 9:
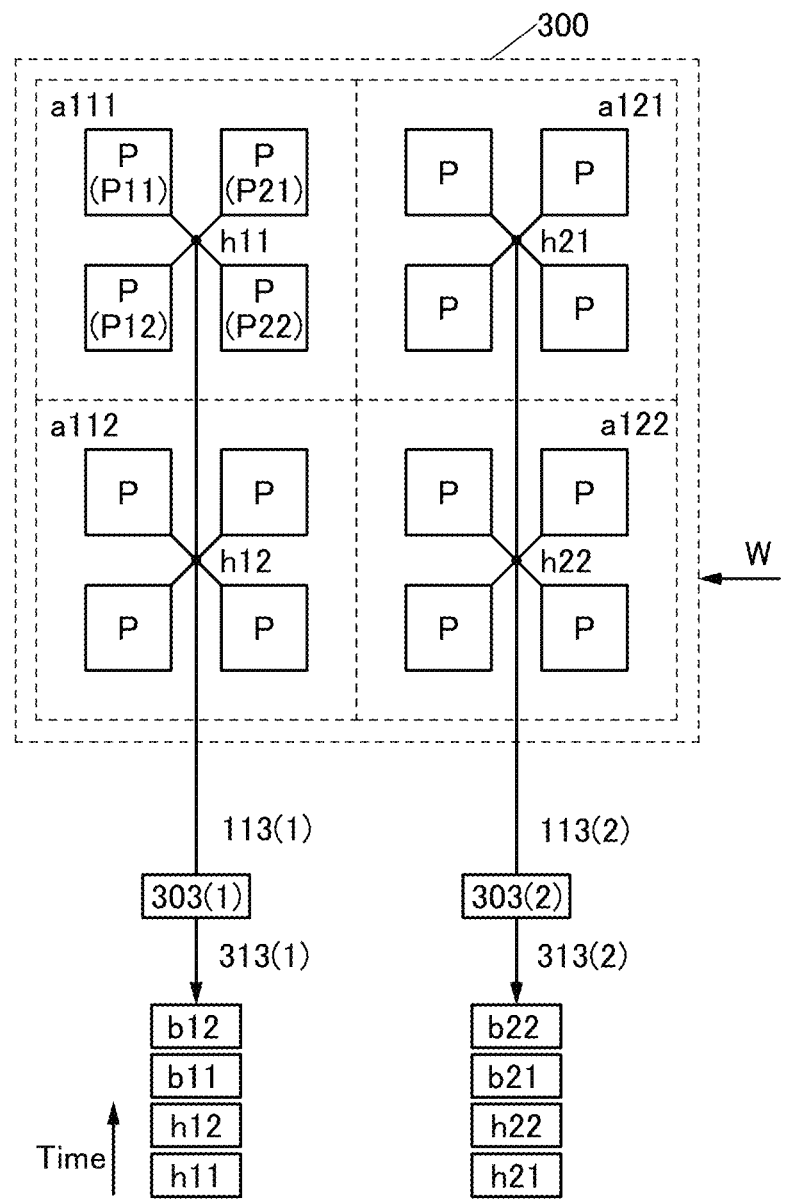
FIG. 9 is a diagram illustrating signals output from an imaging region.

FIG. 9 is a diagram illustrating signals output from the imaging region 300. To simplify the description, FIG. 9 illustrates, as an example, four regions a (the region a111, the region a112, the region a121, and a region a122) obtained by division into a lattice shape, and the regions a each include four pixels P (P11, P12, P21, and P22).

Generation of signals will be described taking the region a111 as an example, and the region a121, the region a112, and the region a122 can output signals through similar operations. Although the case where the region a111 includes four pixels will be described, the number of pixels included in the region a111 is not limited.

In the region a111, the pixels P retain the imaging signals of P11, P12, P21, and P22 in the nodes N. Here, the case where the weight coefficient W is supplied to each of the pixels P is described. The pixel supplied with the weight coefficient W can correct an imaging signal output from the pixel, with use of the weight coefficient W. In the case where the region a111 includes four pixels, the magnitudes of imaging signals output from the pixels supplied with the weight coefficients W are preferably quadrisected. Image data generated by concurrent reading on the four pixels can be equal to image data generated by reading on the pixels not supplied with the weight coefficients W, and then averaged by posttreatment.

More specific description is given. Through the wiring 113(1) and the circuit 303(1), h11 (h11=P11×W+P12×W+P21×W+P22×W), which is the result of arithmetic operation on the imaging signals of P11, P12, P21, and P22, is output. The obtained result of the arithmetic operation is equal to h11=(P11+P12+P21+P22)×W. That is, the same effect is obtained as the case where imaging signals output from the pixels in the region a111 are added together and output, and then arithmetic operation using the weight coefficient W is performed on the output result. Therefore, arithmetic processing (hardware processing or software processing) can be simplified. Simplification of arithmetic processing can reduce power consumption.

Concurrently through a process similar to the above, h21, which is the result of arithmetic operation on imaging signals, is output from the region a121 through the wiring 113(2) and the circuit 303(2), whereby output from the first row of the region a is completed.

Then, in the second row of the region a, through a process similar to the above, h12, which is the result of arithmetic operation on imaging signals, is output from the region a112 through the wiring 113(1) and the circuit 303(1). Concurrently, h22, which is the result of arithmetic operation on imaging signals, is output from the region a122 through the wiring 113(2) and the circuit 303(2), whereby output from the second row of the region a is completed.

The above operation is repeated as necessary. Note that h11, h21, h12, and h22 described above correspond to data obtained when imaging is performed, and b11, b21, b12, and b22 described above correspond to data obtained when imaging is not performed.

Figure 10:
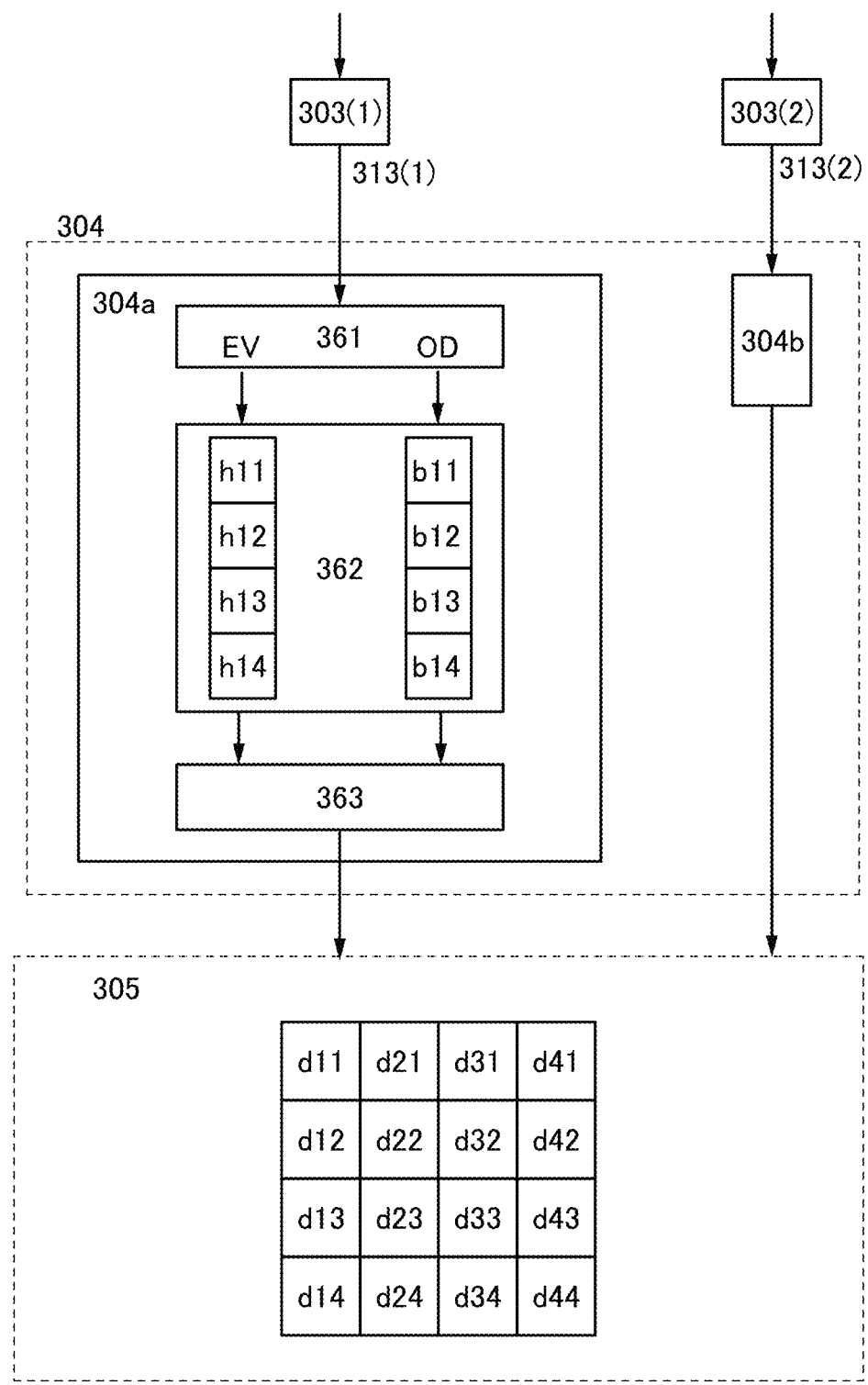
FIG. 10 is a diagram illustrating a circuit 304 and a circuit 305.

FIG. 10 is a diagram illustrating the circuit 304 and the circuit 305. The circuit 304 functions as a CDS circuit. The CDS circuit may be rephrased as a difference detection circuit. A signal processing method will be described taking the output of the circuit 303(1) as an example, and the circuit 303(2) can output a signal through similar operations. Note that the description of the circuit 302 is omitted in FIG. 10.

The circuit 304 (a circuit 304a and a circuit 304b) includes a selector circuit 361, a frame memory 362, and a differential circuit 363. First, to the selector circuit 361, image data (data obtained when imaging is performed or data obtained when imaging is not performed) output from the circuit 303(1) is supplied through a wiring 313(1). The selector circuit 361 supplies to the frame memory 362 the data obtained when imaging is performed or the data obtained when imaging is not performed. The frame memory 362 stores the data obtained when imaging is performed at an even-numbered address (EV) and stores the data obtained when imaging is not performed at an odd-numbered address (OD). Note that the frame memory 362 is preferably an analog memory. The analog memory stores the data obtained when imaging is performed or the data obtained when imaging is not performed as analog data (a voltage value). The use of the analog memory can reduce the conversion cost for quantizing the data obtained when imaging is performed or the data obtained when imaging is not performed and the mount area.

A FIFO (First In First Out) circuit using an analog memory can be used instead of the frame memory 362. Although FIG. 10 shows an example in which h11 to h14, which are the data obtained when imaging is performed, and b11 to b14, which are the data obtained when imaging is not performed, are stored, the number of pieces of data that can be stored is preferably set as needed.

A differential amplifier suitable for comparing analog data is preferably used as the differential circuit 363. With use of the data obtained when imaging is not performed that is stored at an odd-numbered address as a reference, a differential amplifier used as the differential circuit 363 outputs as image data (e.g., d11=h11−b11) a difference between the data obtained when imaging is not performed and the data obtained when imaging is performed that is stored at an even-numbered address.

The image data output from the differential circuit 363 is stored in the circuit 305. FIG. 10 shows an example in which the circuit 305 stores the image data d11 to image data d44. Thus, the image data d11 to the image data d44 correspond to phase image data. Note that the number of pieces of data that can be stored in the circuit 305 is preferably set as needed. The circuit 305 is preferably an analog memory. An analog memory used as the circuit 305 can have an effect similar to that of a frame memory.

Note that a digital memory can be used as the frame memory 362 or the circuit 305. In order to use a digital memory, the data obtained when imaging is performed, the data obtained when imaging is not performed, or image data is required to be quantized. Note that the data obtained when imaging is performed, the data obtained when imaging is not performed, and image data that are quantized have a high resistance to noise. A high resistance to noise enables high-speed operation. In addition, power consumption due to a memory with a lowered voltage can be reduced.

The differential circuit 363 can further have a comparison function. Owing to the comparison function, image data output from the differential circuit 363 can be binarized. The binarized image data can include a feature of the image data that is further emphasized and then extracted. Moreover, since the binarized image data is the compressed image data, the memory capacity can be reduced. A reduction in the memory capacity leads to a small mount area and low power consumption.

Figure 11:
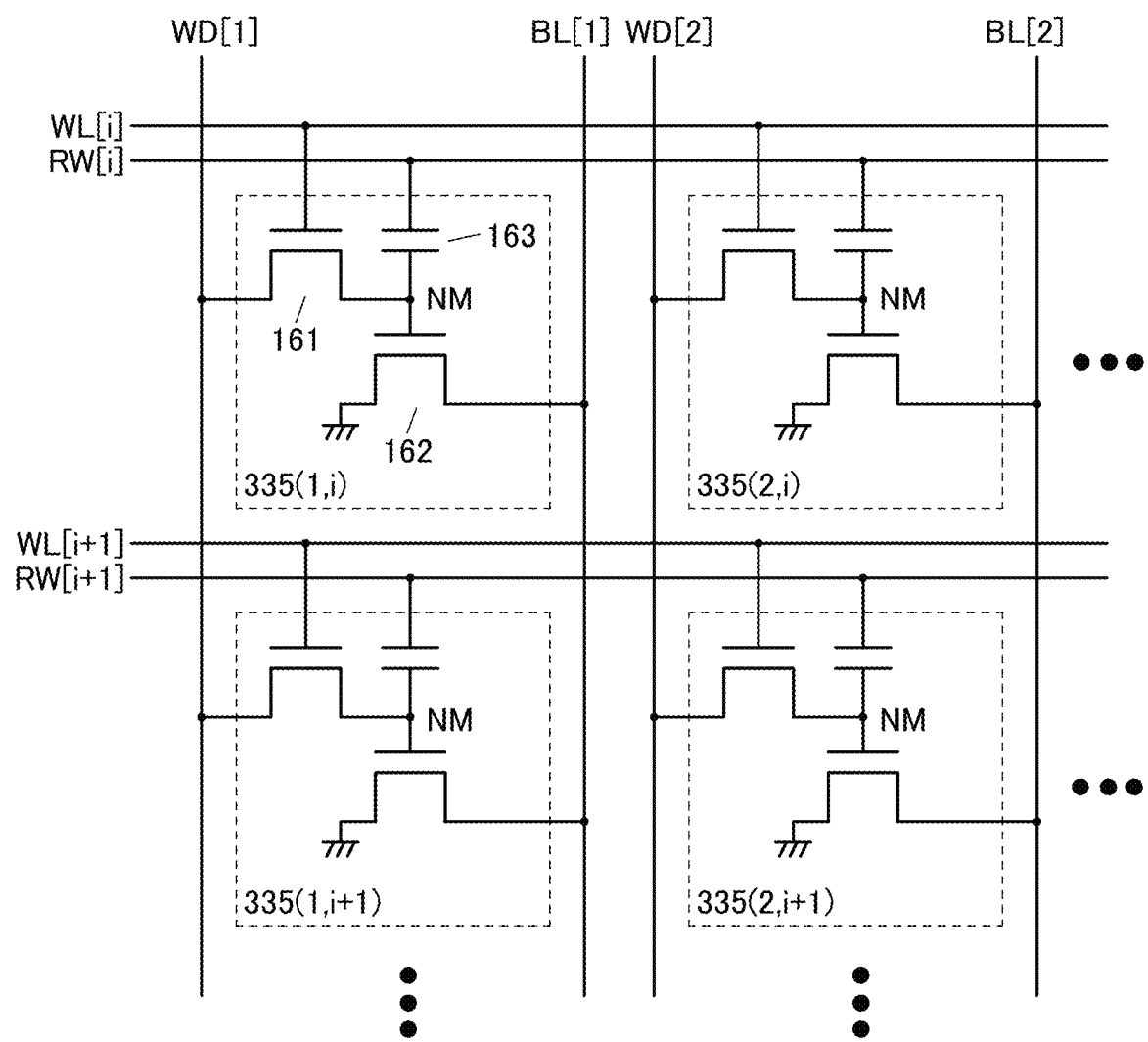
FIG. 11 is a diagram illustrating the circuit 305.

FIG. 11 is a diagram illustrating the circuit 305. The circuit 305 includes a plurality of memory cells 335. In FIG. 11, for example, a memory cell 335(1,$i$) to a memory cell 335(2,$i$+1] are included. The memory cells 335 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point at which the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 335, the other of the source and the drain of the transistor 161 is electrically connected to a wiring WD. The other of the source and the drain of the transistor 162 is electrically connected to a wiring BL.

The wiring WL is preferably connected to a decoder or a shift register.

The wiring RW is supplied with a signal for reading image data written to the memory cell 335. In the case of supplying image data to the memory cell 335, the wiring RW is supplied with a low potential. In the case of reading image data from the memory cell 335, the wiring RW is supplied with a high potential.

The wiring WD is electrically connected to the differential circuit 363. Thus, the wiring WD is supplied with image data. Note that the image data is preferably supplied as analog data. Alternatively, the image data is supplied as digital data obtained by binarizing analog data.

Image data stored in the memory cell 335 can be read from the wiring BL. In the case where the image data is analog data, the wiring BL is connected to a control portion (a processor) through an analog-digital converter circuit. In the case where the image data is binarized digital data, the wiring BL is connected to the control portion through a register.

As described above, one embodiment of the present invention can provide an imaging device with a novel structure that can handle outputs of a plurality of pixels included in regions arranged in a lattice shape as one imaging signal. One embodiment of the present invention can provide an imaging device that processes part of arithmetic operation using a weight coefficient. One embodiment of the present invention can provide an imaging device that can handle data that is larger than an imaging region by performing padding processing. One embodiment of the present invention can provide an imaging device that suppresses an increase in the processing time of arithmetic operation using a weight coefficient and padding processing. One embodiment of the present invention can provide an imaging device that suppresses an increase in power consumption by reducing the amount of arithmetic operation by arithmetic operation using a weight coefficient and padding processing.

Parts of this embodiment can be combined as appropriate for implementation.

Embodiment 2

In this embodiment, an imaging system using the imaging device in Embodiment 1 will be described. With use of the imaging device, the imaging system which is one embodiment of the present invention can reduce the amount of arithmetic operation and can reduce processing time and power to be consumed that are needed for arithmetic operation.

Figure 12:
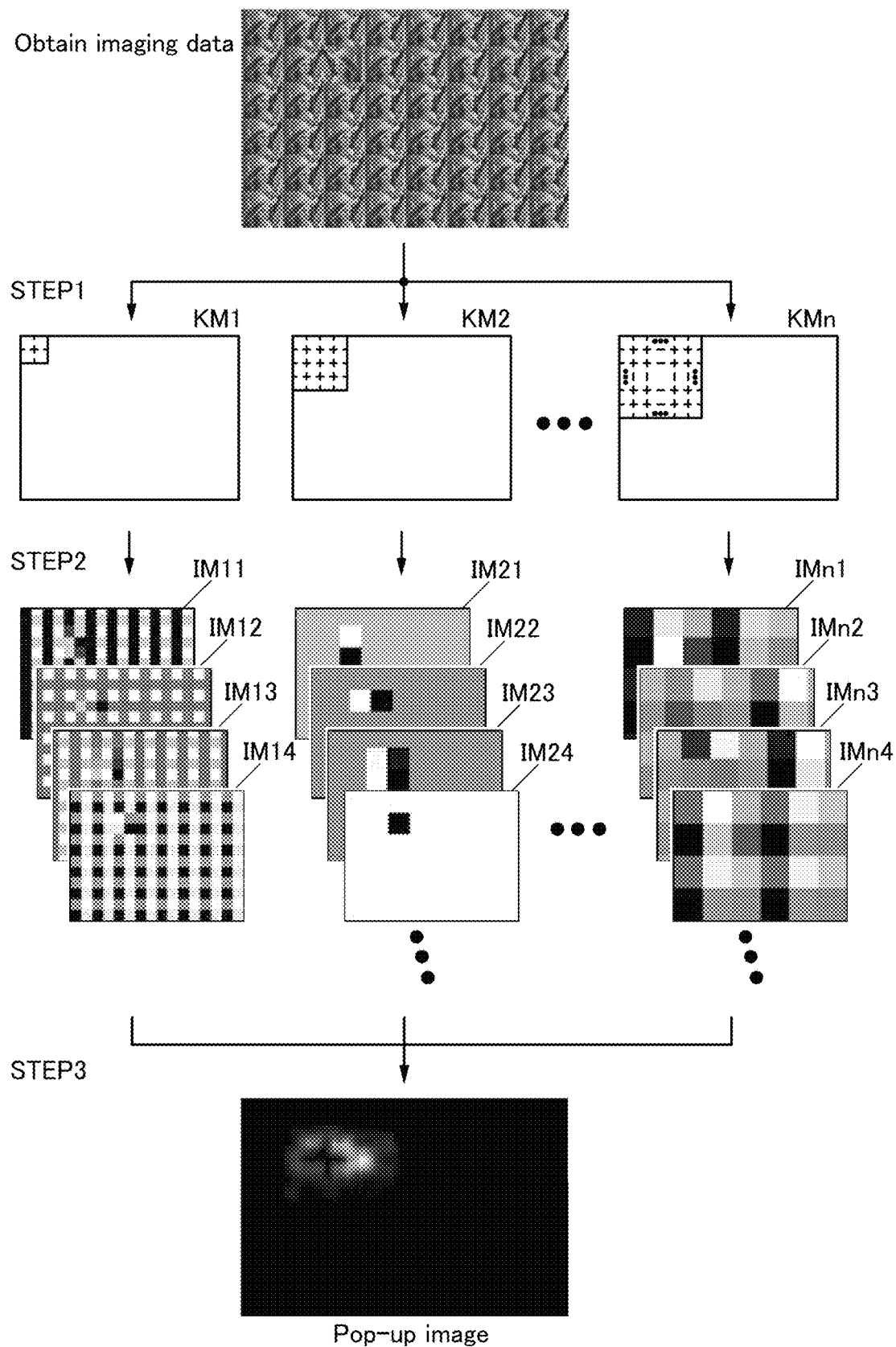
FIG. 12 is a conceptual diagram illustrating a processing method of an imaging system.

FIG. 12 is a conceptual diagram illustrating the imaging system using the imaging device which is one embodiment of the present invention. The imaging system can detect an abnormal portion from imaging data obtained by the imaging device. The imaging system includes at least the imaging device and a processor that controls the imaging device (not illustrated).

First, a processing method of the imaging system will be described with reference to FIG. 12. With use of the imaging device, the imaging system obtains imaging data to be evaluated. The imaging data preferably has regularity.

STEP1 is a step for setting lattice sizes KM to be applied to imaging data. The plurality of lattice sizes can be set. For example, in the case where imaging data has periodicity, it can be determined that the imaging data has regularity. Therefore, in the case where imaging data has periodicity, a feature that appears periodically is preferably set as an interval of the lattice size. It is further preferable that a plurality of lattice sizes be set using an interval, which is set by a feature that appears periodically, as a center. For example, a lattice size KM1 to a lattice size KMn are set in FIG. 12.

STEP2 is a step for generating phase image data using the lattice sizes KM. First, a method for generating the phase image data is described. In the case of using the lattice size KM1, for example, the region a selected by the lattice size KM1 includes four pixels in the lattice size KM1. The phase image data is generated using a plurality of pieces of image data generated by arithmetic operation on imaging signals output from the pixels included in the region a. Thus, four kinds of phase image data, phase image data IM11 to phase image data IM14, are generated using the lattice size KM1.

As another example, the region a selected by the lattice size KM2 includes 16 pixels in the lattice size KM2. Thus, 16 kinds of phase image data, phase image data IM21 to phase image data IM216, are generated using the lattice size KM2. Thus, as the lattice size is larger, the larger number of kinds of phase image data is generated. Note that the region a selected by the lattice size KMn includes n pixels in the lattice size KMn. Thus, n kinds of phase image data are generated using the lattice size KMn.

STEP3 is a step for performing arithmetic operation on the phase image data generated using the lattice sizes to generate a pop-up image. As the arithmetic operation, multiplication or accumulation is preferably performed.

As an example of pretreatment, first image data is generated by accumulating the phase image data IM11 to the phase image data IM14 generated using the lattice size KM1. Then, second image data is generated by accumulating the phase image data IM21 to the phase image data IM216 generated using the lattice size KM2. Then, n-th image data is generated by accumulating the n kinds of phase image data generated using the lattice size KMn.

Next, the pop-up image is generated by accumulating the first image data to the n-th image data. Note that there is a problem in that the first image data to the n-th image data include a different number of pieces of image data.

Therefore, division into the original number of pixels in the imaging region is performed using the lattice sizes used for generating the first image data to the n-th image data, whereby first image data_b to n-th image data_b including the same number of pieces of image data are generated. The first image data_b to the n-th image data_b are image data including a region with no regularity that is extracted as a feature through the generation of the phase image data.

Next, the pop-up image is generated by accumulating the first image data_b to the n-th image data_b.

Figure 13:
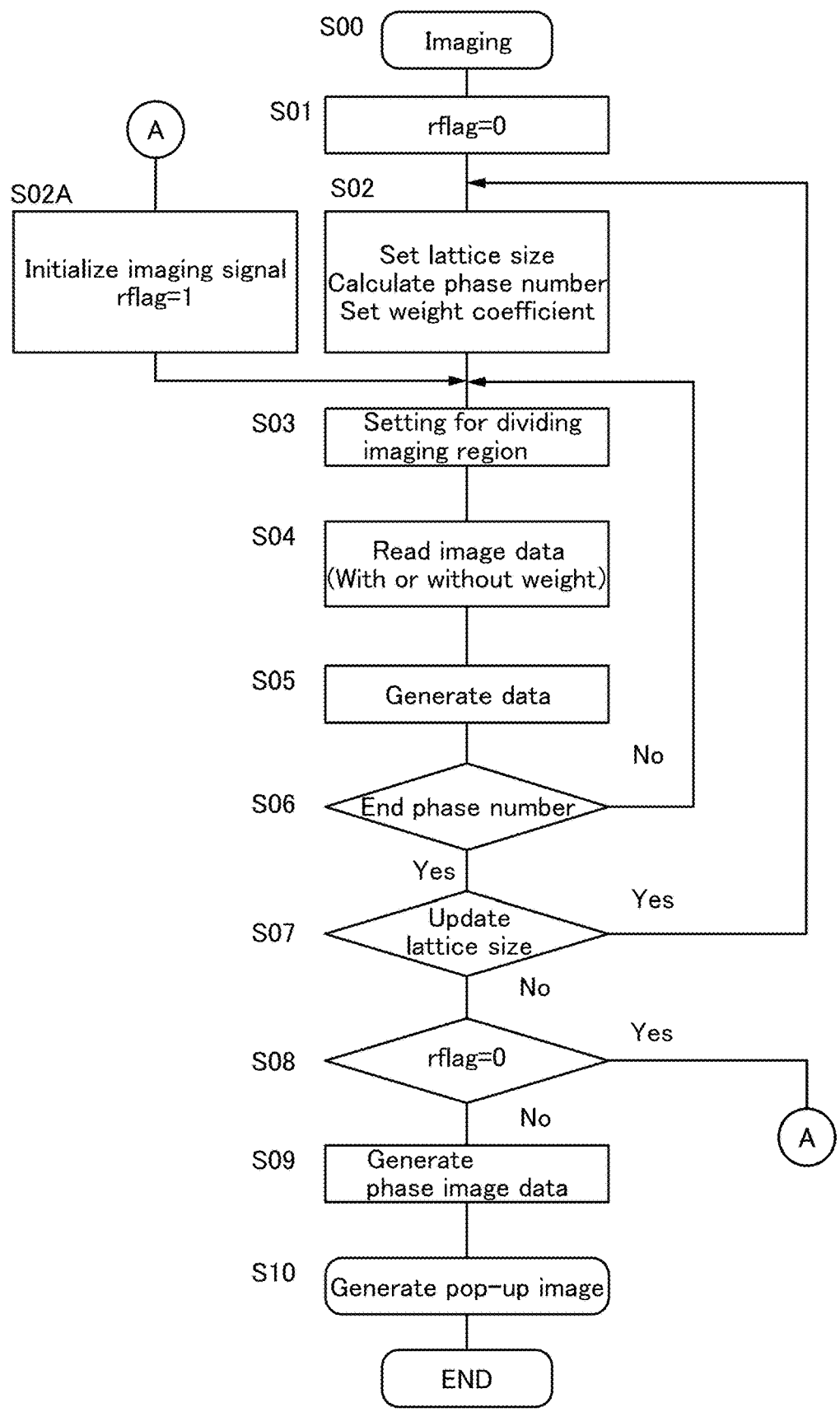
FIG. 13 is a flow chart illustrating an imaging system.

FIG. 13 is a flow chart illustrating the imaging system.

Step S00 is a step in which the imaging device obtains imaging data. The imaging device preferably obtains imaging data by a global shutter method. When the pixel included in the imaging device includes an OS transistor, degradation of an imaging signal can be suppressed and the imaging signal can be retained.

Step S01 is a step in which the imaging system sets a flag rflag for controlling processing modes. The processing modes include a mode in which imaging data is read and subjected to arithmetic operation, and a mode in which imaging data is initialized and subjected to arithmetic operation. In the mode in which imaging data is read and subjected to arithmetic operation, "0" is set to the flag rflag. In the mode in which initialized imaging data is subjected to arithmetic operation, "1" is set to the flag rflag. Note that data obtained when imaging is performed is generated in the mode in which imaging data is read and subjected to arithmetic operation, and data obtained when imaging is not performed is generated in the mode in which imaging data output from an initialized pixel is subjected to arithmetic operation.

Step S02 is a step in which the imaging system performs various settings for processing imaging data. A lattice size to be applied is set, for example. The phase number is set in accordance with the lattice size. A weight coefficient is set in accordance with the phase number. A plurality of kinds of lattice sizes can be set. Moreover, the imaging system can include a step of extracting regularity from imaging data.

Step S03 is a step in which the imaging system divides the imaging region using the lattice size. In the case of dividing the imaging region, a base point corresponding to a pixel included in a region set by the lattice size is given. To divide the imaging region using the lattice size, a switch module is set as appropriate by a control portion using a processor or the like. Note that in the case where a pixel included in the region does not exist (is insufficient), a dummy pixel is set. The dummy pixel is virtually added to the region by padding processing by a padding circuit. Dummy data output from the dummy pixel is preferably set as appropriate.

Step S04 is a step of reading image data. Each image data is output as an accumulated value of imaging signals output from a pixel group included in the region set by the lattice size. By supplying weight coefficients to the regions, the accumulated values can be averaged to be output.

Step S05 is a step of generating the data obtained when imaging is performed or the data obtained when imaging is not performed. In the mode in which imaging data is read and subjected to arithmetic operation, the data obtained when imaging is performed is generated. In the mode in which initialized imaging data is subjected to arithmetic operation, the data obtained when imaging is not performed is generated. The data obtained when imaging is performed or the data obtained when imaging is not performed is generated by reading image data from the region set by the lattice size.

Step S06 is a step of determining whether the data obtained when imaging is performed or the data obtained when imaging is not performed corresponding to the phase number set by the lattice size is obtained. The process moves to Step S07 in the case where the data obtained when imaging is performed or the data obtained when imaging is not performed corresponding to the set phase number is obtained, or the process moves to Step S03 in other cases.

Step S07 is a step of determining whether the data obtained when imaging is performed or the data obtained when imaging is not performed corresponding to the kind of the set lattice size is obtained. The process moves to Step S08 in the case where the data obtained when imaging is performed or the data obtained when imaging is not performed corresponding to the set lattice size is obtained, or the process moves to Step S02 in other cases.

Step S08 is a step of determining whether the flag rflag is "0". The flag rflag is "0" just after the mode in which imaging data is read and subjected to arithmetic operation is completed. Thus, the process moves to Step S02A in the case where the flag rflag is "0", or the process moves to Step S09 in other cases.

Here, Step S02A is described. Step S02A is a step of moving to the mode in which imaging data obtained in S00 is initialized and subjected to arithmetic operation. To the flag rflag, "1" is set. For the setting of the lattice size, the setting of the phase number, the setting of a weight coefficient, or the like, information set in Step S02 is used.

Step S09 is a step of generating phase image data with use of a difference between the data obtained when imaging is performed and the data obtained when imaging is not performed. The phase image data is generated in accordance with the kind of the set lattice size.

In Step S10, a pop-up image is generated by arithmetic operation on a plurality of pieces of phase image data generated in Step S09.

Figure 14:
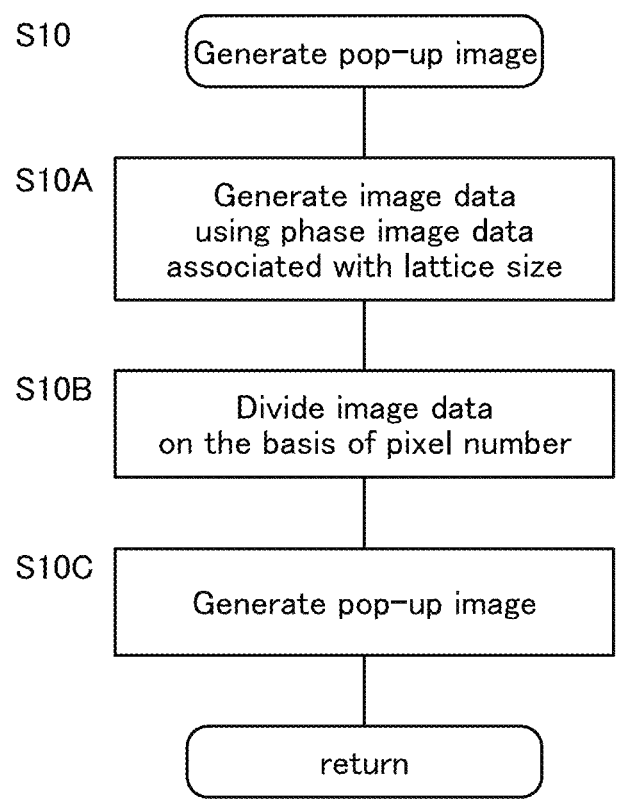
FIG. 14 is a flow chart illustrating an imaging system.

FIG. 14 is a flow chart illustrating generation of the pop-up image.

In Step S10A, the imaging system generates image data by performing arithmetic operation on the phase image data associated with the lattice sizes. As the arithmetic operation, multiplication or accumulation is preferably performed.

More specific description is given below. As an example of pretreatment, first image data is generated by accumulating the phase image data IM1 to the phase image data IM4 generated using the lattice size KM1. Then, second image data is generated by accumulating the phase image data IM1 to the phase image data IM16 generated using the lattice size KM2. Then, n-th image data is generated by accumulating then kinds of phase image data generated using the lattice size KMn.

Step S10B is a step in which the imaging system divides the image data into pieces of data that are the same in number as the pixels included in the imaging region. It is because the first image data to the n-th image data include a different number of pieces of image data. Therefore, division into the original number of pixels in the imaging region is performed using the lattice sizes used for generating the first image data to the n-th image data, whereby the first image data_b to the n-th image data_b including the same number of pieces of image data are generated.

Step S10C is a step in which the imaging system generates the pop-up image. The imaging system generates the pop-up image including an extracted feature by accumulating the first image data_b to the n-th image data_b.

Figure 15:
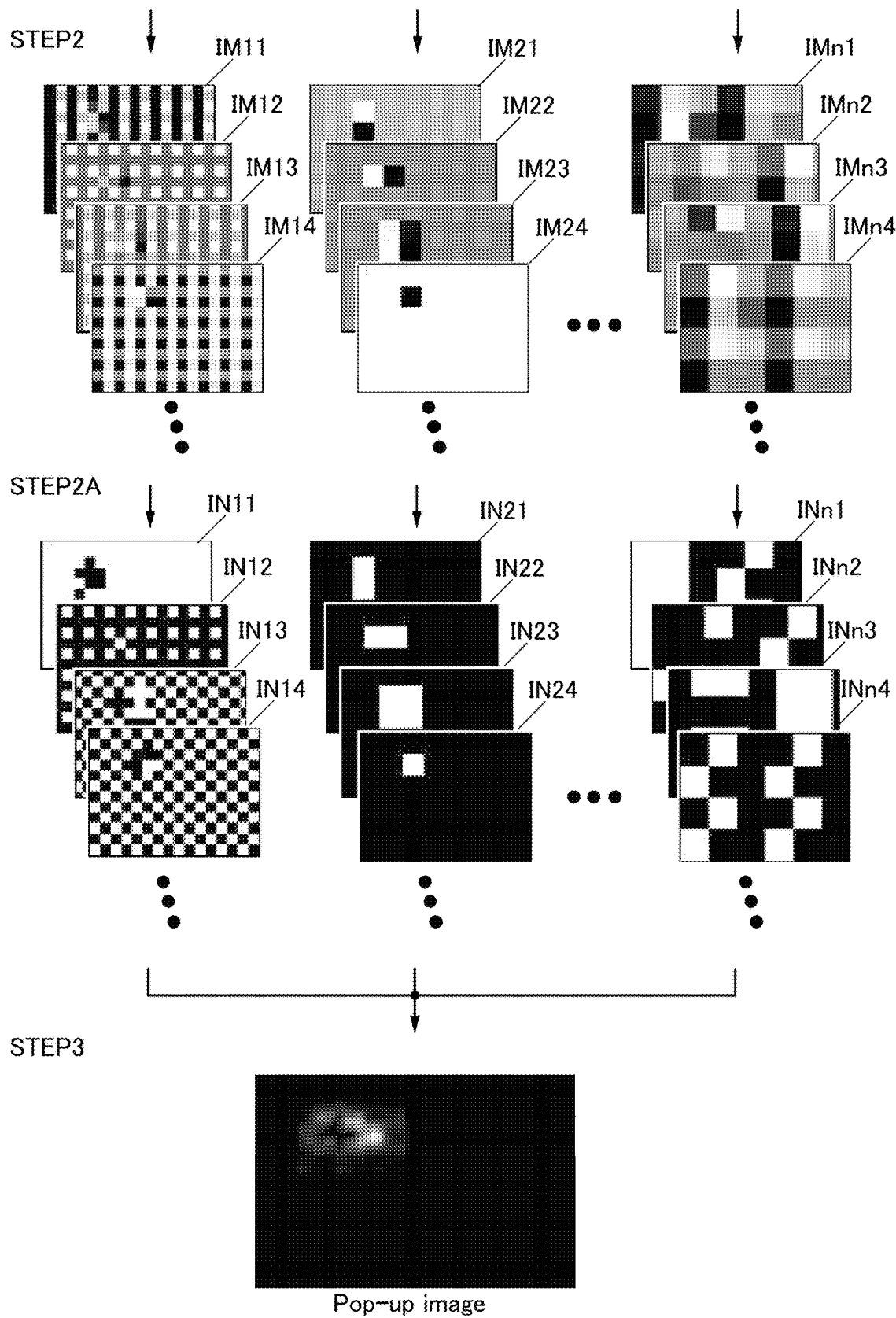
FIG. 15 is a conceptual diagram illustrating a processing method of an imaging system.

FIG. 15 is a conceptual diagram illustrating an imaging system different from that in FIG. 12. Note that in the structure described below, the same portions or portions having similar functions are denoted by the same reference numerals in common in different drawings and repetitive description thereof will be omitted. Thus, the detailed description of STEP2 and STEP3, which are the same as STEP2 and STEP3 described with reference to FIG. 12, is omitted.

FIG. 15 is different from FIG. 12 in including STEP2A. STEP2A is a step of binarizing phase image data. For example, the phase image data IM11 to the phase image data IM14 generated in STEP2 are converted into the phase image data IN11 to the phase image data IN14 through binarization processing. In a similar manner, other phase image data are also binarized.

For example, first image data is generated by performing arithmetic operation on the phase image data IN11 to the phase image data IN14 generated using the lattice size KM1. Then, second image data is generated by performing arithmetic operation on phase image data IN21 to phase image data IN216 generated using the lattice size KM2. Then, n-th image data is generated by performing arithmetic operation on the n kinds of phase image data generated using the lattice size KMn.

As the arithmetic operation, multiplication is preferably performed. For example, in the case where image data of a certain region included in phase image data is "0", the result of arithmetic operation using the image data is "0" regardless of the value of image data of the same region included in another phase image data. Thus, the amount of arithmetic operation can be reduced.

Figure 16:
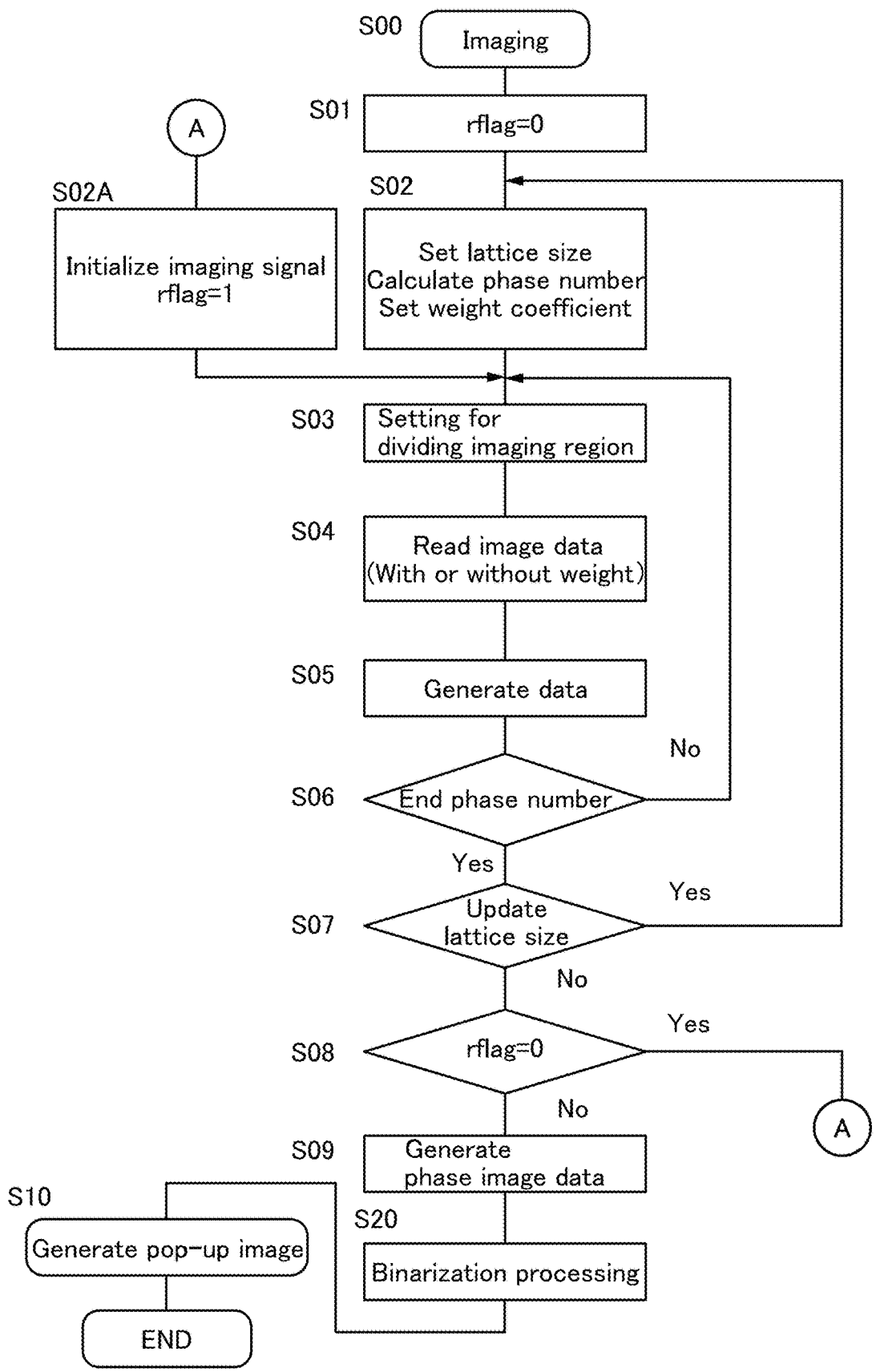
FIG. 16 is a flow chart illustrating an imaging system.

FIG. 16 is a flow chart illustrating an imaging system that performs binarization processing. Note that in the structure described below, the same portions or portions having similar functions are denoted by the same reference numerals in common in different drawings and repetitive description thereof will be omitted.

The imaging system described with reference to FIG. 16 is different from that in FIG. 13 in including Step S20. The phase image data generated in Step S09 is subjected to the binarization processing, whereby the amount of arithmetic operation performed for generating the pop-up image in Step S10 can be reduced.

As described above, one embodiment of the present invention can provide an imaging system with a novel structure that can handle outputs of a plurality of pixels included in regions arranged in a lattice shape as one imaging signal. One embodiment of the present invention can provide an imaging system that processes part of arithmetic operation using a weight coefficient. One embodiment of the present invention can provide an imaging system that can handle data that is larger than an imaging region by performing padding processing. One embodiment of the present invention can provide an imaging system that suppresses an increase in the processing time of arithmetic operation using a weight coefficient and padding processing. One embodiment of the present invention can provide an imaging system that suppresses an increase in power consumption by reducing the amount of arithmetic operation by arithmetic operation using a weight coefficient and padding processing.

Parts of this embodiment can be combined as appropriate for implementation.

Embodiment 3

In this embodiment, structure examples and the like of the imaging device of one embodiment of the present invention are described.

<Structure Example>

Figure 17A:
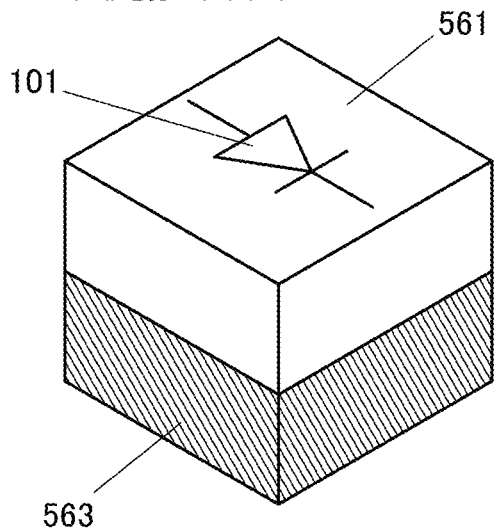
FIG. 17A to FIG. 17D are diagrams illustrating structures of a pixel of an imaging device.

FIG. 17A is a diagram showing a structure example of a pixel of an imaging device, in which a stacked-layer structure including a layer 561 and a layer 563 can be employed.

Figure 18A:
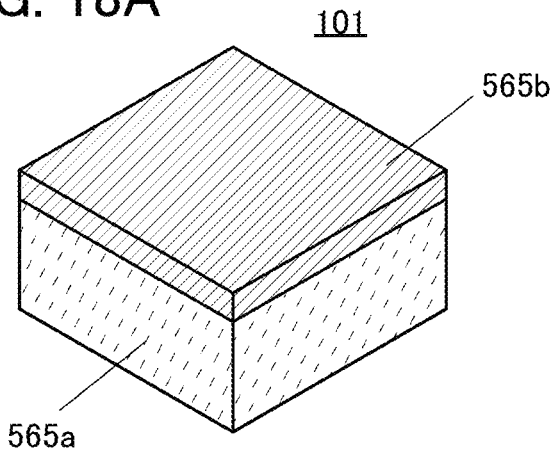
FIG. 18A to FIG. 18C are diagrams illustrating structures of a photoelectric conversion device.

The layer 561 includes the photoelectric conversion device 101. The photoelectric conversion device 101 can include a layer 565a and a layer 565b as illustrated in FIG. 18A. Note that the term "layer" may be replaced with the term "region".

The photoelectric conversion device 101 illustrated in FIG. 18A is a pn-junction photodiode; for example, a p-type semiconductor can be used for the layer 565a and an n-type semiconductor can be used for the layer 565b. Alternatively, an n-type semiconductor may be used for the layer 565a and a p-type semiconductor may be used for the layer 565b.

Typically, the pn-junction photodiode can be formed using single crystal silicon.

Figure 18B:
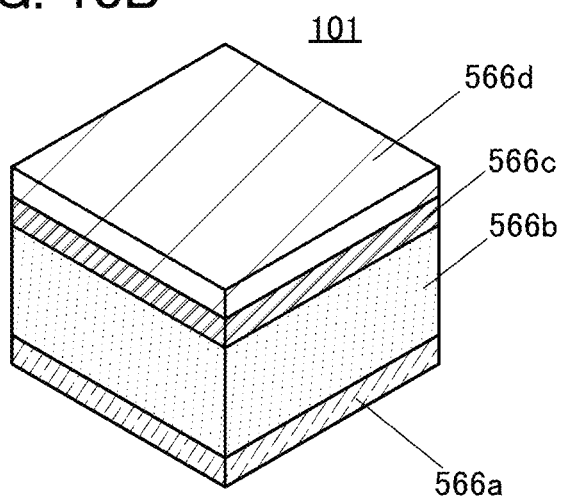

The photoelectric conversion device 101 included in the layer 561 may have a stacked-layer structure of a layer 566a, a layer 566b, a layer 566c, and a layer 566d as illustrated in FIG. 18B. The photoelectric conversion device 101 illustrated in FIG. 18B is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 18C:
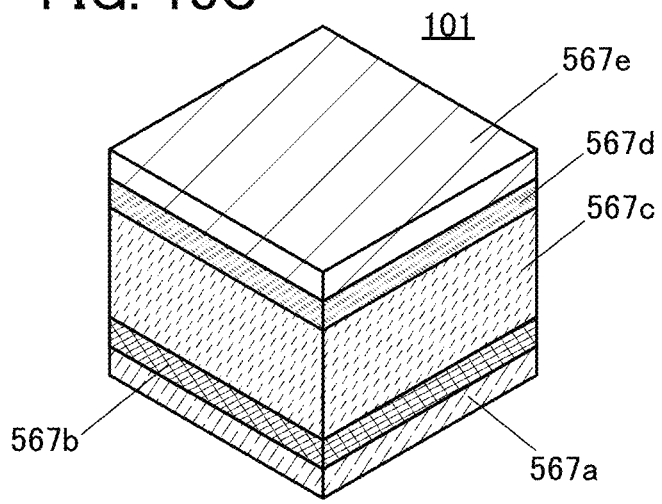

The photoelectric conversion device 101 included in the layer 561 may be a stacked layer of a layer 567a, a layer 567b, a layer 567c, a layer 567d, and a layer 567e as illustrated in FIG. 18C. The photoelectric conversion device 101 illustrated in FIG. 18C is an example of an organic optical conductive film, and the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used.

For the layer 563 illustrated in FIG. 17A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a neural network, a communication circuit, or the like can be formed. Alternatively, a memory circuit such as a DRAM (Dynamic Random Access Memory), a CPU (Central Processing Unit), an MCU (Micro Controller Unit), or the like may be formed. Note that the above-described circuits except the pixel circuit are referred to as functional circuits in this embodiment.

For example, some or all of the transistors included in the pixel circuits (the pixels P) and the functional circuits (the circuits 301, 302, 303, 304, 305, and the like) described in Embodiment 1 can be provided in the layer 563.

Figure 17B:
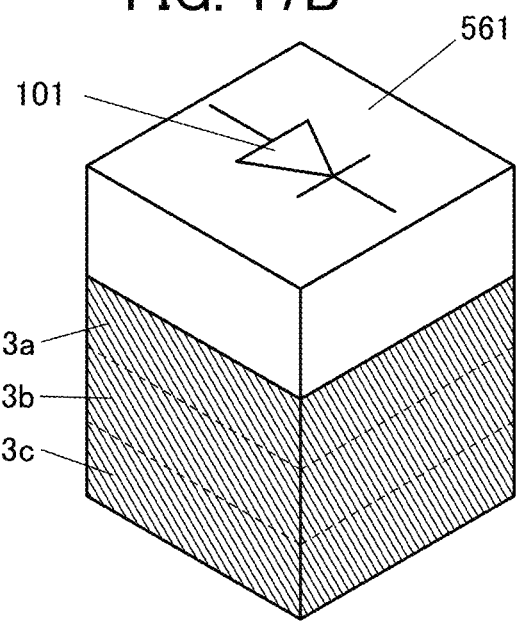

The layer 563 may be a stacked layer of a plurality of layers as illustrated in FIG. 17B. FIG. 17B illustrates three layers, the layers 563a, 563b, and 563c, as an example, but the number of layers may be two. Alternatively, the layer 563 may be a stacked layer of four or more layers. These layers can be stacked through a bonding process, for example. In this structure, the pixel circuits and the functional circuits are dispersed in a plurality of layers and the pixel circuits and the functional circuits can be provided to overlap with each other; thus, a small and high-performance imaging device can be manufactured.

Figure 17C:
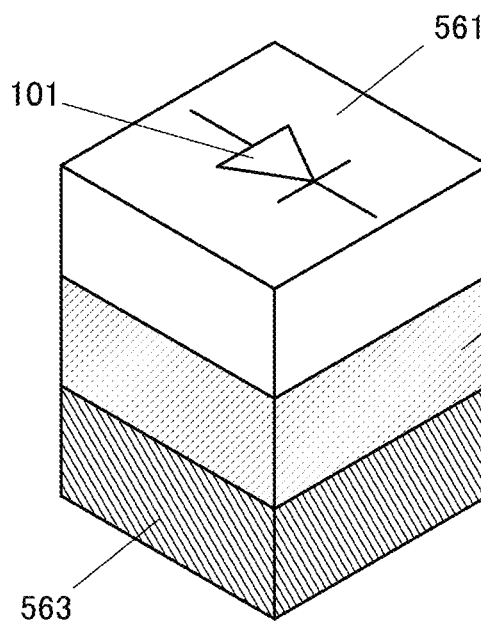

Furthermore, the pixel may have a stacked-layer structure of the layer 561, the layer 562, and the layer 563 as illustrated in FIG. 17C.

The layer 562 can include an OS transistor. One or more of the above-described functional circuits may be formed using an OS transistor. Alternatively, one or more of the functional circuits may be formed using the Si transistor in the layer 563 and the OS transistor in the layer 562.

A normally-off CPU (also referred to as "Noff-CPU") can be formed using an OS transistor and a Si transistor, for example. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 17D:
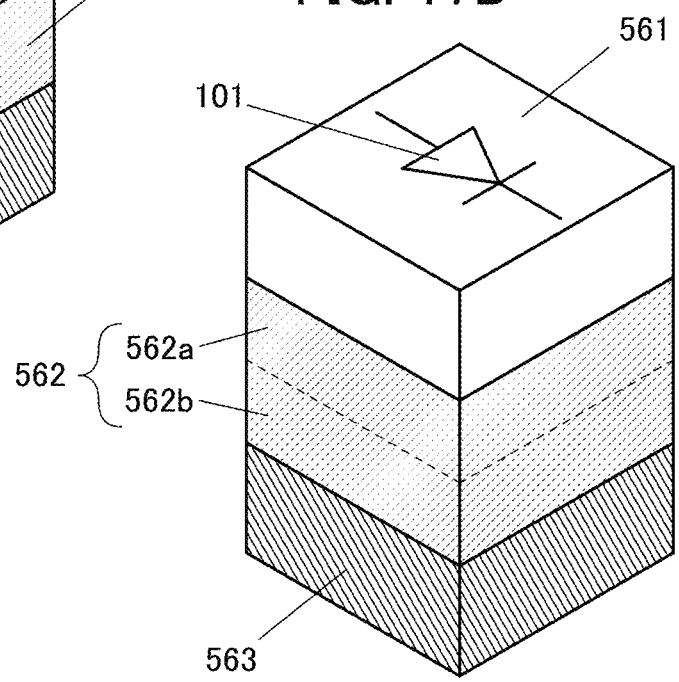

The layer 562 may be a stacked layer of a plurality of layers as illustrated in FIG. 17D. FIG. 17D illustrates two layers, a layer 562a and the layer 563b, as an example, but a stacked layer of three or more layers may be used. These layers can be formed to be stacked over the layer 563, for example. Alternatively, a stacked layer may be formed by bonding a layer formed over the layer 563 to a layer formed over the layer 561.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/\text{cm}^3$, preferably lower than or equal to $1\times10^{15}/\text{cm}^3$, further preferably lower than or equal to $1\times10^{13}/\text{cm}^3$, still further preferably lower than or equal to $1\times10^{11}/\text{cm}^3$, even further preferably lower than $1\times10^{10}/\text{cm}^3$, and higher than or equal to $1\times10^{-9}/\text{cm}^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, $InO_{X1}$, where X1 is a real number greater than 0) or indium zinc oxide (hereinafter, $In_{X2}Zn_{Y2}O_{Z2}$, where X2, Y2, and Z2 are real numbers greater than 0), and gallium oxide (hereinafter, $GaO_{X3}$, where X3 is a real number greater than 0) or gallium zinc oxide (hereinafter, $Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device is described with reference to a cross-sectional view. Note that components described below such as an insulating layer and a conductive layer are examples, and other components may also be included. Alternatively, some components described below may be omitted. The stacked-layer structure described below can be formed employing a bonding step, a polishing step, or the like as needed.

Figure 19:
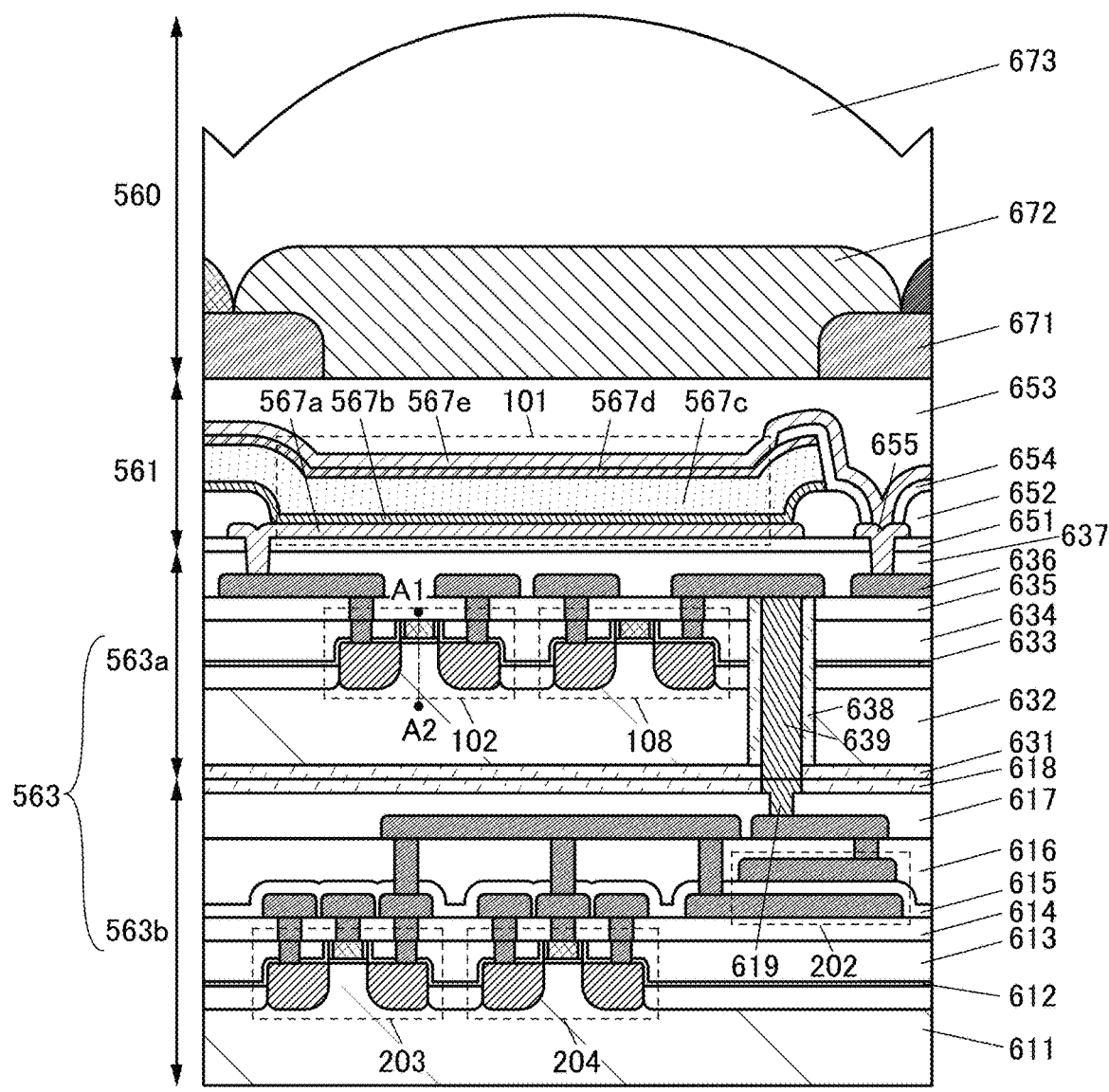
FIG. 19 is a cross-sectional view illustrating a pixel.

FIG. 19 is an example of a cross-sectional view of a stack including a layer 560, the layer 561, and the layer 563 and including a bonding surface between the layer 563a and the layer 563b that are included in the layer 563.

<Layer 563b>

The layer 563b includes a functional circuit provided on a silicon substrate 611. Here, the capacitor 202, the transistor 203, and the transistor 204 that are included in the circuit 303 are illustrated as parts of the functional circuit. The one electrode of the capacitor 202, the one of the source and the drain of the transistor 203, and the gate of the transistor 204 are electrically connected to each other.

In the layer 563b, the silicon substrate 611 and insulating layers 612, 613, 614, 615, 616, 617, and 618 are provided. The insulating layer 612 has a function of a protective film. The insulating layers 613, 613, 616, and 617 each have a function of an interlayer insulating film and a planarization film. The insulating layer 615 has a function of a dielectric layer of the capacitor 202. The insulating layer 618 and a conductive layer 619 each have a function of a bonding layer. The conductive layer 619 is electrically connected to the one electrode of the capacitor 202.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of acrylic, polyimide, or the like can be used. As the dielectric layer of the capacitor, a silicon nitride film, a silicon oxide film, an aluminum oxide film, or the like can be used. The bonding layer will be described later.

For a conductor that can be used as a wiring, an electrode, and a plug that are used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected to be used as appropriate. The conductor is not limited to a single layer, and may be a plurality of layers including different materials.

<Layer 563a>

The layer 563a includes the components of the pixel P. Here, the transistor 102 and the transistor 108 are illustrated as some of the components of the pixel P. In the cross-sectional view shown in FIG. 19, electrical connection between these transistors is not illustrated.

In the layer 563a, a silicon substrate 632 and insulating layers 631, 633, 634, 635, 637, and 638 are provided. Conductive layers 636 and 639 are also provided.

The insulating layer 631 and the conductive layer 639 each have a function of a bonding layer. The insulating layers 634, 635, and 637 each have a function of an interlayer insulating film and a planarization film. The insulating layer 633 has a function of a protective film. The insulating layer 638 has a function of insulating the silicon substrate 632 from the conductive layer 639. The insulating layer 638 can be formed using a material similar to that for another insulating layer. The insulating layer 638 may be formed using the same material as the insulating layer 631.

The conductive layer 639 is electrically connected to the other of the source and the drain of the transistor 108 and the conductive layer 619. The conductive layer 636 is electrically connected to the wiring 113 (see FIG. 3A).

Figure 20A:
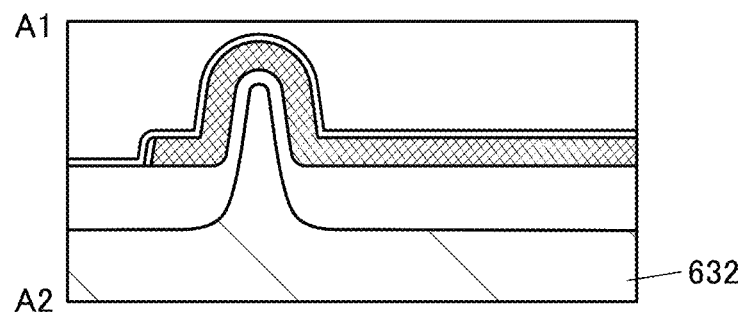
FIG. 20A to FIG. 20C are diagrams illustrating Si transistors.
Figure 20B:
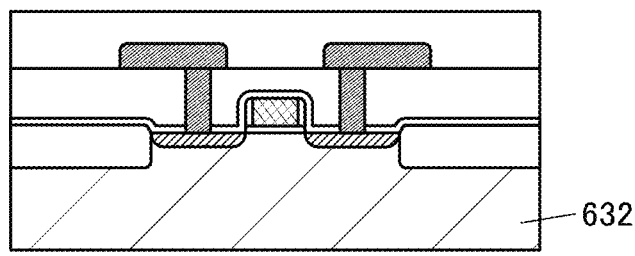

The Si transistors illustrated in FIG. 19 each have a fin-type structure including a channel formation region in the silicon substrates (the silicon substrates 611 and 632). FIG. 20A shows a cross section in the channel width direction (a cross section taken along A1-A2 shown in the layer 563a in FIG. 19). The Si transistors may each have a planar-type structure as illustrated in FIG. 20B.

Figure 20C:
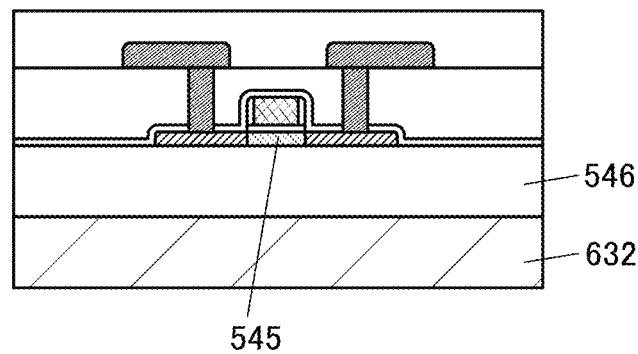

Alternatively, as illustrated in FIG. 20C, transistors each including a semiconductor layer 545 of a silicon thin film may be used. The semiconductor layer 545 can be single crystal silicon (SOI (Silicon on Insulator)) formed on an insulating layer 546 on the silicon substrate 611, for example.

<Layer 561>

The layer 561 includes the photoelectric conversion device 101. The photoelectric conversion device 101 can be formed over the layer 563a. FIG. 19 shows a structure in which an organic photoconductive film illustrated in FIG. 18C is used as a photoelectric conversion layer of the photoelectric conversion device 101. Note that here, the layer 567a is a cathode and the layer 567e is an anode.

In the layer 561, insulating layers 651, 652, 653, and 654 and a conductive layer 655 are provided.

The insulating layers 651, 653, and 654 each have a function of an interlayer insulating film and a planarization film. The insulating layer 654 is provided to cover an end portion of the photoelectric conversion device 101, and has a function of preventing a short circuit between the layer 567e and the layer 567a. The insulating layer 652 has a function of an element isolation layer. An organic insulating film or the like is preferably used as the element isolation layer.

The layer 567a corresponding to the cathode of the photoelectric conversion device 101 is electrically connected to the one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can inhibit entry of light into an adjacent pixel. As the light-blocking layer 671, a metal layer of aluminum, tungsten, or the like can be used. The metal layer and a dielectric film having a function of an anti-reflection film may be stacked.

For the optical conversion layer 672, a color filter can be used. When colors of (red), G (green), B (blue), Y (yellow), C (cyan), M (magenta), and the like are assigned to the color filters of respective pixels, a color image can be obtained.

When a wavelength cut filter is used as the optical conversion layer 672, the imaging device can obtain images in various wavelength regions.

For example, when a filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When a filter that blocks light having a wavelength longer than or equal to that of visible light is used as the optical conversion layer 672, an ultraviolet imaging device can be obtained.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like with a high light-transmitting property with respect to visible light.

<Bonding>

Next, bonding of the layer 563b and the layer 563a is described.

The insulating layer 618 and the conductive layer 619 are provided in the layer 563b. The conductive layer 619 includes a region embedded in the insulating layer 618. Furthermore, surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, surfaces of the insulating layer 631 and the conductive layer 639 are planarized to be level with each other.

Here, main components of the conductive layer 619 and the conductive layer 639 are preferably the same metal element. Furthermore, it is preferable that the insulating layer 618 and the insulating layer 631 be formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding where a boundary between the layer 563b and the layer 563a is a bonding position can be performed.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

With the bonding, the electrical connection between the conductive layer 619 and the conductive layer 639 can be obtained. Moreover, the connection between the insulating layer 618 and insulating layer 631 with mechanical strength can be obtained.

For bonding the metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method also causes bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

By the above-described bonding, the circuit 303 included in the layer 563b can be electrically connected to the components of the pixel P included in the layer 563a.

<Modification Example of Stacked-Layer Structure 1>

Figure 21:
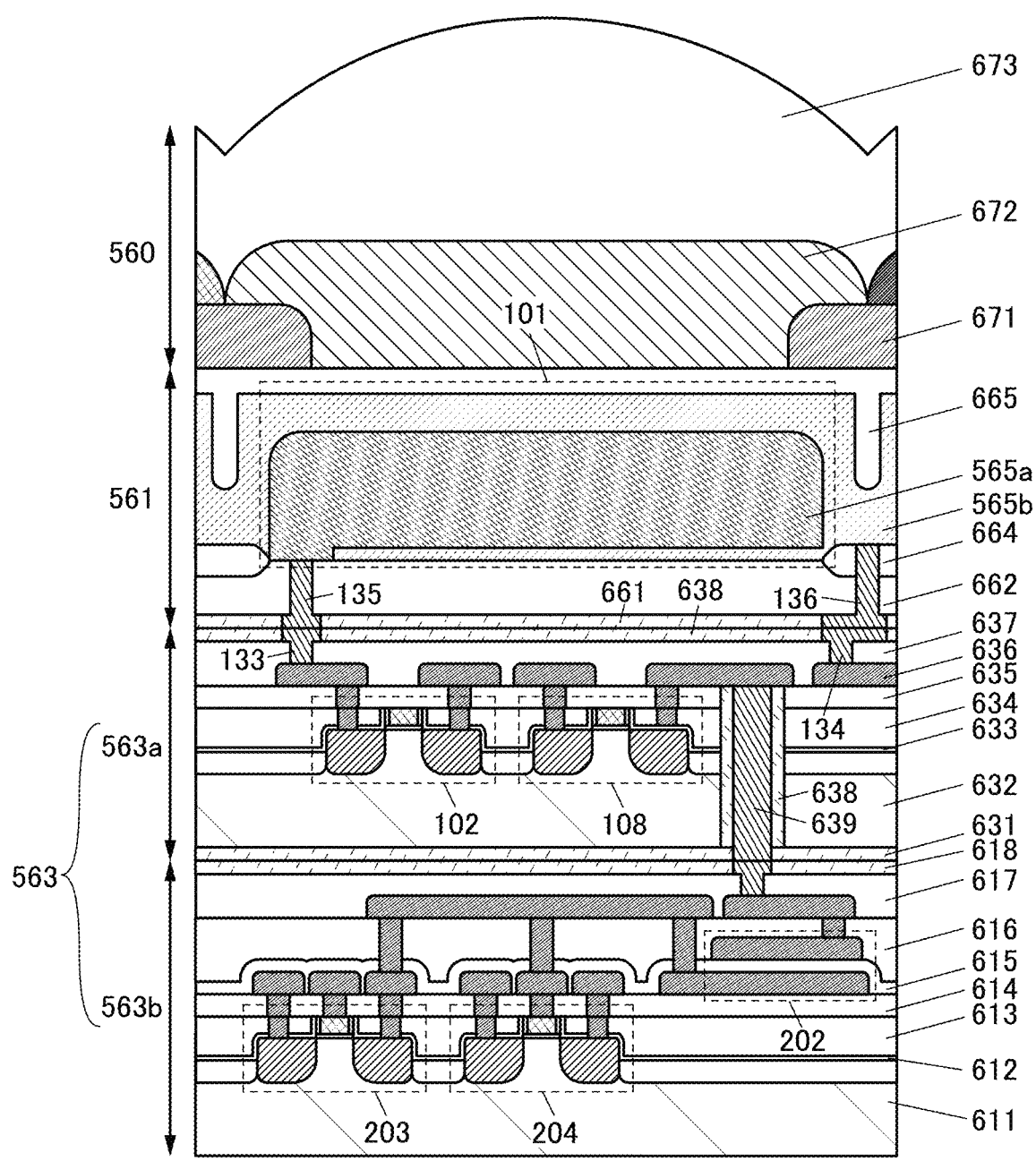
FIG. 21 is a cross-sectional view illustrating a pixel.

FIG. 21 shows a modification example of the stacked-layer structure illustrated in FIG. 19. The structure is different from that in FIG. 19 in the structure of the photoelectric conversion device 101 included in the layer 561 and part of the structure of the layer 563a, and includes a bonding surface also between the layer 561 and the layer 563a.

The layer 561 includes the photoelectric conversion device 101, insulating layers 661, 662, 664, and 665 and conductive layers 135 and 136.

The photoelectric conversion device 101 is a pn-junction photodiode formed on a silicon substrate and includes the layer 565b corresponding to a p-type region and the layer 565a corresponding to an n-type region. The photoelectric conversion device 101 is a pinned photodiode and can reduce noise by inhibiting dark current with a thin p-type region (part of the layer 565b) provided on the surface side (the current extraction side) of the layer 565a.

The insulating layer 661 and the conductive layers 135 and 136 each have a function of a bonding layer. The insulating layer 662 has a function of an interlayer insulating film and a planarization film. The insulating layer 664 has a function of an element isolation layer. The insulating layer 665 has a function of suppressing outflow of carriers.

The silicon substrate is provided with a groove that separates pixels, and the insulating layer 665 is provided on the top surface of the silicon substrate and in the groove. The insulating layer 665 can suppress outflow of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, the element isolation layer may be formed by an STI (Shallow Trench Isolation) method, or the like. The insulating layer 665 can be formed using an inorganic insulating film of silicon oxide, silicon nitride, or the like or an organic insulating film of polyimide, acrylic, or the like, for example. The insulating layer 665 may have a multilayer structure.

The layer 565a (the n-type region, corresponding to the cathode) of the photoelectric conversion device 101 is electrically connected to the conductive layer 135. The layer 565b (the p-type region, corresponding to the anode) is electrically connected to the conductive layer 136. The conductive layers 135 and 136 each include a region embedded in the insulating layer 661. Furthermore, surfaces of the insulating layer 661 and the conductive layers 135 and 136 are planarized to be level with each other.

In the layer 563a, the insulating layer 638 is formed over the insulating layer 637. A conductive layer 133 electrically connected to the one of the source and the drain of the transistor 102 and a conductive layer 134 electrically connected to the conductive layer 636 are formed.

The insulating layer 638 and the conductive layers 133 and 134 each have a function of a bonding layer. The conductive layers 133 and 134 each include a region embedded in the insulating layer 638. Furthermore, surfaces of the insulating layer 638 and the conductive layers 133 and 134 are planarized to be level with each other.

Here, the conductive layers 133, 134, 135, and 136 are the same bonding layers as the conductive layers 619 and 639 described above. The insulating layers 638 and 661 are the same bonding layers as the insulating layers 618 and 631 described above.

Thus, by bonding the conductive layer 133 to the conductive layer 135, the layer 565a (an n-type region, corresponding to a cathode) of the photoelectric conversion device can be electrically connected to the one of the source and the drain of the transistor 102. Moreover, by bonding the conductive layer 134 to the conductive layer 136, the layer 565b (a p-type region, corresponding to an anode) of the photoelectric conversion device can be electrically connected to the wiring 113 (see FIG. 3). Furthermore, by bonding the insulating layer 638 to the insulating layer 661, the layer 561 can be electrically and mechanically bonded to the layer 563a.

<Stacked-Layer Structure 2>

Figure 22:
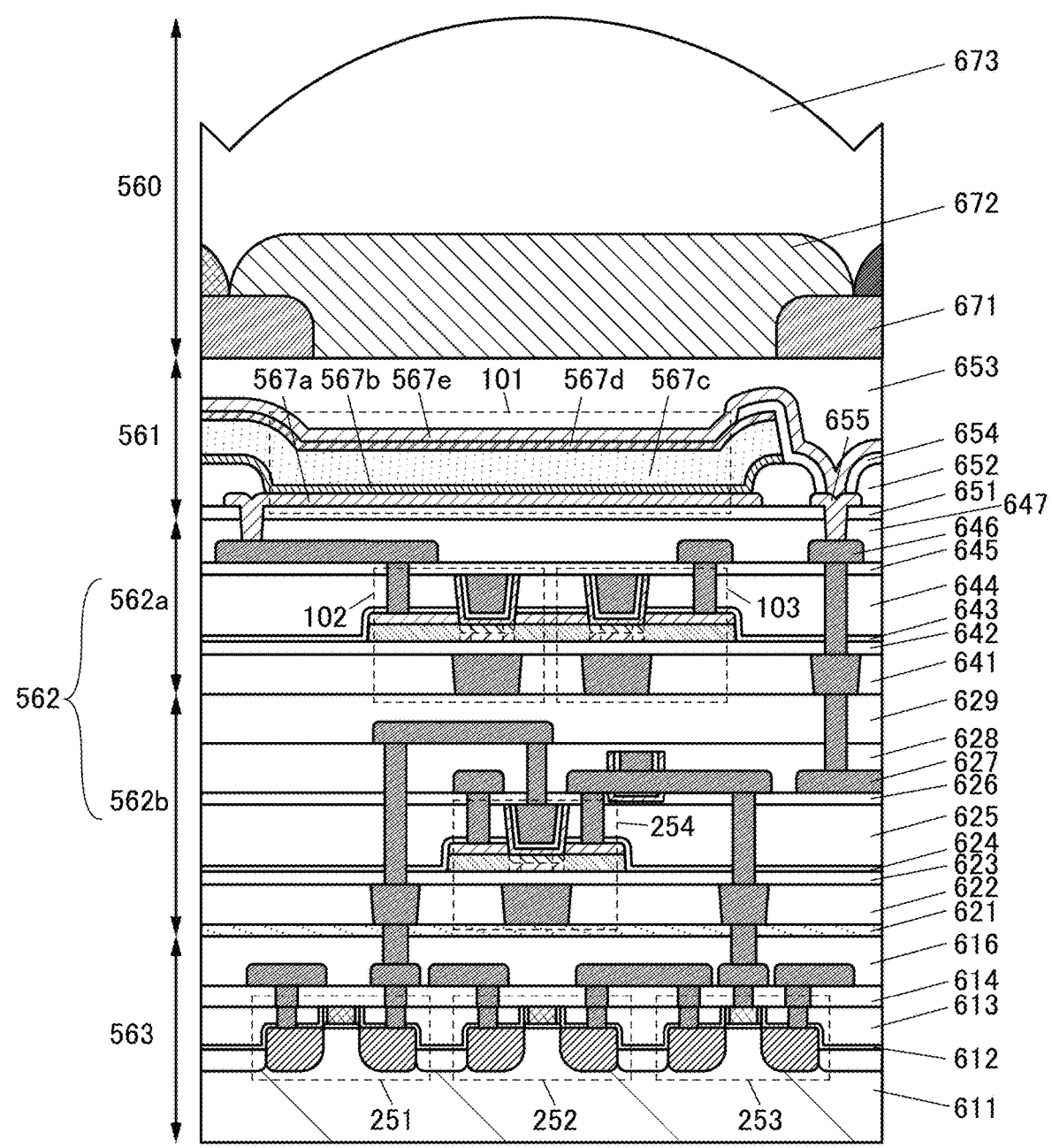
FIG. 22 is a cross-sectional view illustrating a pixel.

FIG. 22 is an example of a cross-sectional view of a stack including the layers 560, 561, 562, and 563 and not including a bonding surface. Si transistors are provided in the layer 563. OS transistors are provided in the layer 562. Here, an example is described in which the components of the memory circuit are provided in the layer 562 and the layer 563 and a driver circuit of the memory circuit is provided in the layer 563. Note that since the structures of the layer 561 and the layer 560 are the same as the structures illustrated in FIG. 19, the description thereof is omitted here.

<Layer 563>

The layer 563 includes a functional circuit provided on the silicon substrate 611. Here, the transistor 251 included in the driver circuit of the memory circuit and the transistors 252 and 253 included in the memory circuit are illustrated as parts of the functional circuit.

<Layer 562b>

A layer 562b is formed over the layer 563. The layer 562b includes an OS transistor. Here, a transistor 254 is illustrated as a part of the memory circuit.

In the layer 562b, insulating layers 621, 622, 623, 624, 625, 626, 628, and 629 are provided. Moreover, a conductive layer 627 is provided. The conductive layer 627 can be electrically connected to the wiring 113 (see FIG. 3).

The insulating layer 621 has a function of a blocking layer. The insulating layers 622, 623, 625, 626, 628, and 629 each have a function of an interlayer insulating film and a planarization film. The insulating layer 624 has a function of a protective film.

As the blocking layer, a film that has a function of preventing diffusion of hydrogen is preferably used. In a Si device, hydrogen is necessary to terminate dangling bonds; however, hydrogen in the vicinity of an OS transistor is one factor of generating carriers in the oxide semiconductor layer, which leads to a decrease in reliability. Therefore, a hydrogen blocking film is preferably provided between a layer in which the Si device is formed and a layer in which the OS transistor is formed.

As the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The memory circuits included in the layer 563 and the layer 562b each include the transistor 254, the transistor 253, and the transistor 252 in the memory cell. One of a source and a drain of the transistor 254 is electrically connected to a gate of the transistor 253. A gate of the transistor 254 is electrically connected to the transistor 251 included in the driver circuit of the memory circuit.

In the memory cell, the gate of the transistor 253 is a data retention portion and the transistor 254 performs data writing. By turning on the transistor 252, reading is performed on the memory cell. When an OS transistor having a low off-state current is used as the transistor 254 connected to the data retention portion, data retention time can be longer. For details, the description of a NOSRAM or the like in the following embodiment can be referred to.

Figure 23A:
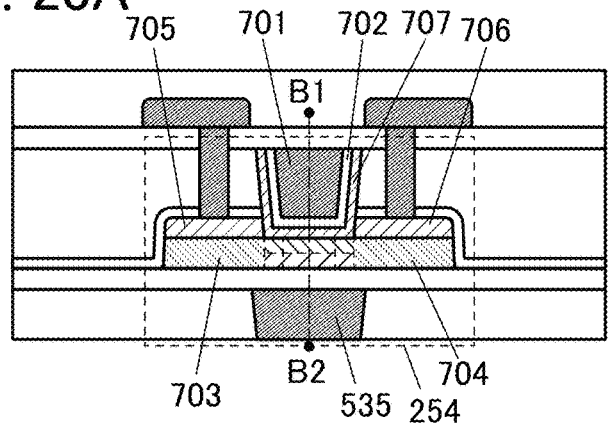
FIG. 23A to FIG. 23D are diagrams illustrating OS transistors.

The details of an OS transistor are illustrated in FIG. 23A. The OS transistor illustrated in FIG. 23A has a self-aligned structure in which a source electrode 705 and a drain electrode 706 are formed through provision of an insulating layer over a stacked layer of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The groove may further be provided with an oxide semiconductor layer 707.

Figure 23B:
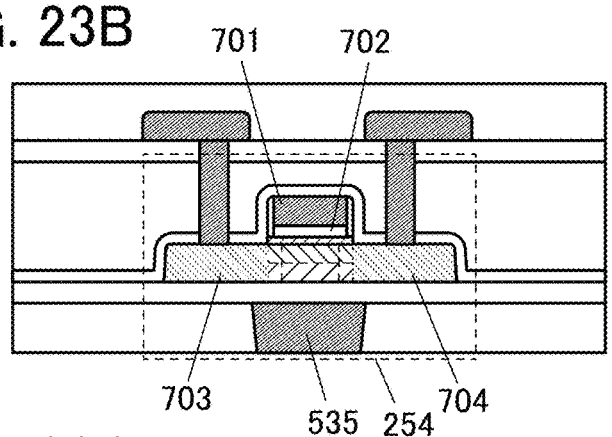

As illustrated in FIG. 23B, the OS transistor may have a self-aligned structure in which the source region 703 and the drain region 704 are formed in the semiconductor layer with the gate electrode 701 as a mask.

Figure 23C:
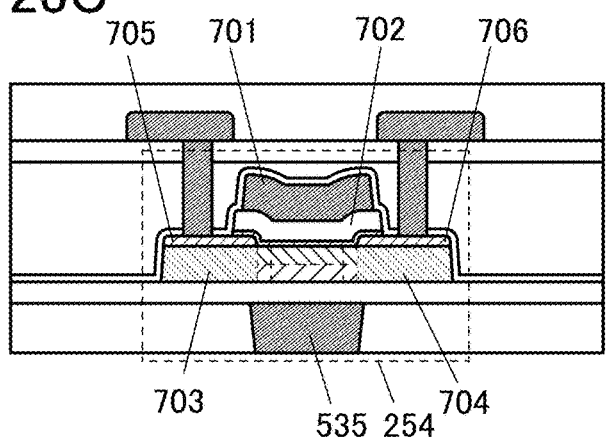

As illustrated in FIG. 23C, the OS transistor may be a non-self-aligned top-gate transistor including a region where the source electrode 705 or the drain electrode 706 overlaps with the gate electrode 701.

Figure 23D:
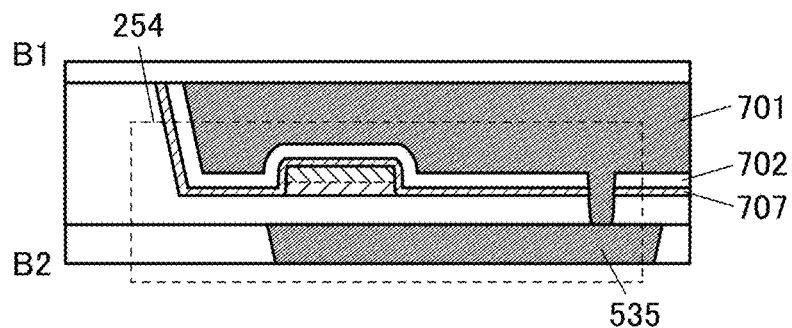

Although the OS transistor having a structure with a back gate 535 is illustrated, a structure without a back gate may be employed. As illustrated in a cross-sectional view of the transistor in the channel width direction in FIG. 23D, the back gate 535 may be electrically connected to a front gate of the transistor, which is provided to face the back gate. Note that FIG. 23D illustrates a cross-section taken along B1-B2 of the transistor of FIG. 23A as an example; however, the same applies to the transistors having the other structures. A structure in which different fixed potentials can be supplied to the back gate 535 and the front gate may be employed.

<Layer 562a>

The layer 562a is formed over the layer 562b. The layer 562a includes the components of the pixel P that includes OS transistors. Here, the transistor 102 and the transistor 103 are illustrated as some of the components of the pixel P.

In the layer 562a, insulating layers 641, 642, 643, 644, 645, and 647 are provided. Moreover, a conductive layer 646 is provided.

The insulating layers 641, 642, 644, 645, and 647 each have a function of an interlayer insulating film and a planarization film. The insulating layer 643 has a function of a protective film.

The one of the source and the drain of the transistor 102 is electrically connected to the cathode of the photoelectric conversion device 101 included in the layer 561. The conductive layer 646 is electrically connected to the anode of the photoelectric conversion device 101 and the conductive layer 627 included in the layer 562b.

Although not illustrated in the cross-sectional view in FIG. 22, the pixel circuit included in the layer 562a can be electrically connected to the circuit 303 included in the layer 563. Furthermore, the circuit 303 can be electrically connected to another functional circuit.

<Modification Example of Stacked-Layer Structure 2>

Figure 24:
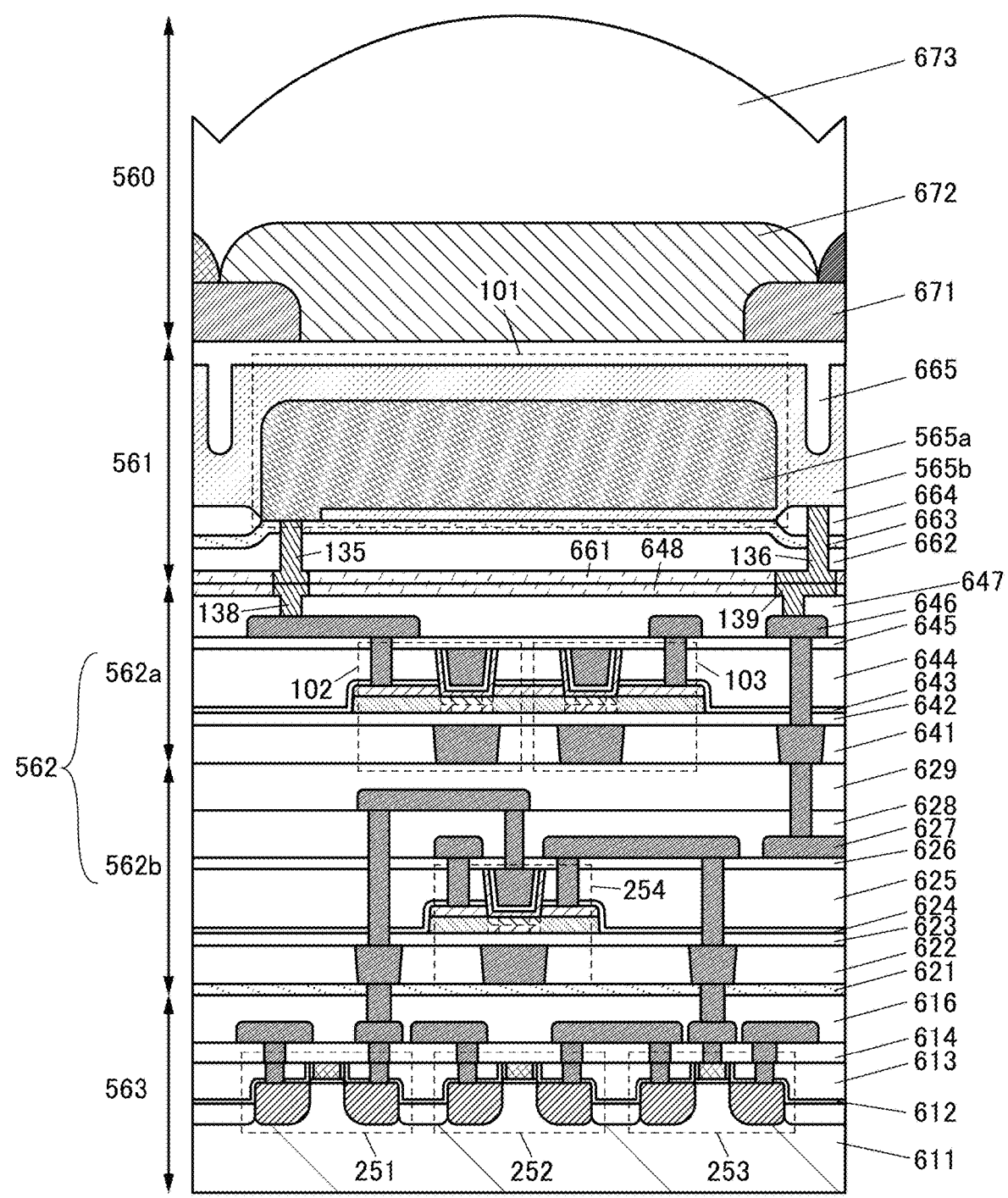
FIG. 24 is a cross-sectional view illustrating a pixel.

FIG. 24 shows a modification example of the stacked-layer structure illustrated in FIG. 23. The structure is different from that in FIG. 23 in the structure of the photoelectric conversion device 101 included in the layer 561 and part of the structure of the layer 562a, and includes a bonding surface also between the layer 561 and the layer 562a.

The photoelectric conversion device 101 included in the layer 561 is a pn-junction photodiode formed on the silicon substrate and has a structure similar to that illustrated in FIG. 21.

In the layer 562a, an insulating layer 648 is formed over the insulating layer 647. A conductive layer 138 electrically connected to the one of the source and the drain of the transistor 102 and a conductive layer 139 electrically connected to the conductive layer 646 are formed.

The insulating layer 648 and the conductive layers 138 and 139 each have a function of a bonding layer. The conductive layers 138 and 139 each include a region embedded in the insulating layer 648. Furthermore, surfaces of the insulating layer 648 and the conductive layers 133 and 134 are planarized to be level with each other.

Here, the conductive layers 138 and 139 are the same bonding layers as the conductive layers 619 and 639 described above. The insulating layer 648 is the same bonding layer as the insulating layers 618 and 631 described above.

Thus, by bonding the conductive layer 138 to the conductive layer 135, the layer 565a (an n-type region, corresponding to a cathode) of the photoelectric conversion device can be electrically connected to the one of the source and the drain of the transistor 102. Moreover, by bonding the conductive layer 139 to the conductive layer 136, the layer 565b (a p-type region, corresponding to an anode) of the photoelectric conversion device can be electrically connected to the wiring 113 (see FIG. 3). Furthermore, by bonding the insulating layer 648 to the insulating layer 661, the layer 561 can be electrically and mechanically bonded to the layer 562a.

In the case of stacking a plurality of Si devices, a plurality of polishing steps and bonding steps are necessary. Accordingly, there are problems such as the large number of steps, necessity for a dedicated apparatus, and low yield, and manufacturing cost is high. An OS transistor can be formed to be stacked over a silicon substrate on which a device is formed, and thus a bonding step can be skipped.

FIG. 25A1 is an external perspective view of the top surface side of a package in which an image sensor chip is placed. The package includes a package substrate 410 to which an image sensor chip 450 (see FIG. 25A3) is fixed, a cover glass 420, an adhesive 430 for bonding them, and the like.

FIG. 25A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

Figure 26A:
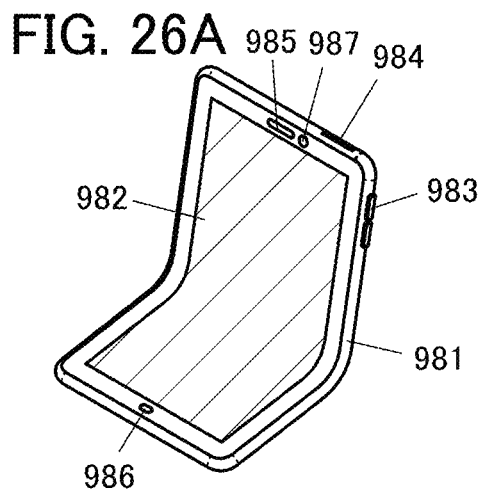
FIG. 26A, FIG. 26B, FIG. 26C, FIG. 26D, FIG. 26E, and FIG. 26F are diagrams illustrating electronic devices.

FIG. 26A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 25B1 is an external perspective view of the top surface side of a camera module in which an image sensor chip is placed in a package with a built-in lens. The camera module includes a package substrate 411 to which an image sensor chip 451 (FIG. 25B3 is fixed, a lens cover 421, a lens 435, and the like. Furthermore, an IC chip 490 (FIG. 25B3 having functions of a driver circuit, a signal conversion circuit, and the like of the imaging device is provided between the package substrate 411 and the image sensor chip 451; thus, the structure as an SiP (System in package) is included.

FIG. 25B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 25B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with the other embodiments as appropriate.

Embodiment 4

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 26A to FIG. 26F.

FIG. 26A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for the mobile phone.

Figure 26B:
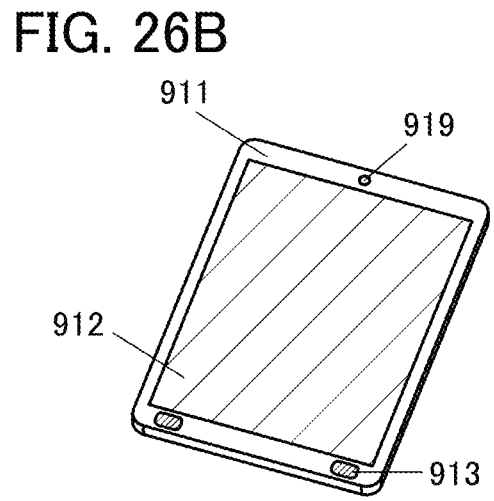

FIG. 26B is a portable data terminal, which includes a housing 911, a display portion 912, a speaker 913, a camera 919, and the like. A touch panel function of the display portion 912 enables input and output of information. Furthermore, a character or the like in an image that is obtained by the camera 919 can be recognized and the character can be voice-output from the speaker 913. The imaging device of one embodiment of the present invention and the operation method thereof can be used for the portable data terminal.

Figure 26C:
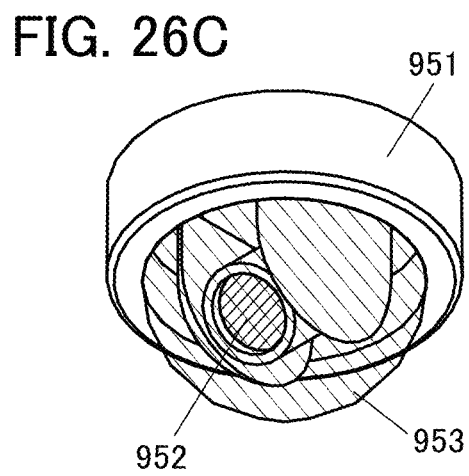

FIG. 26C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 26D:
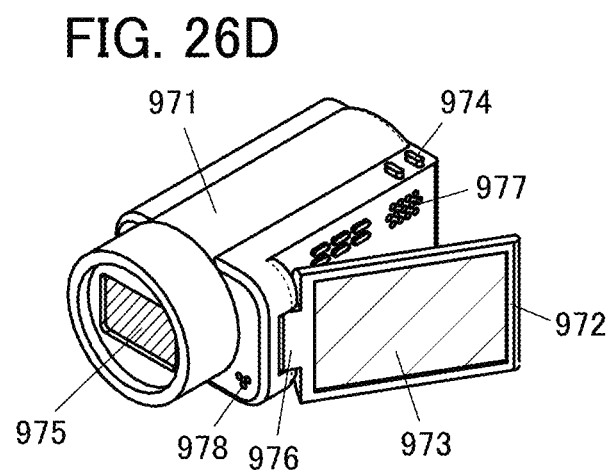

FIG. 26D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for the video camera.

Figure 26E:
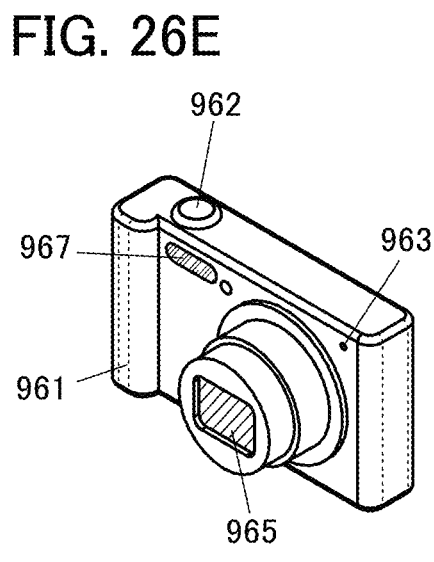

FIG. 26E is a digital camera, which includes a housing 961, a shutter button 962, a microphone 963, a light-emitting portion 967, a lens 965, and the like. The imaging device of one embodiment of the present invention and the operation method thereof can be used for the digital camera.

Figure 26F:
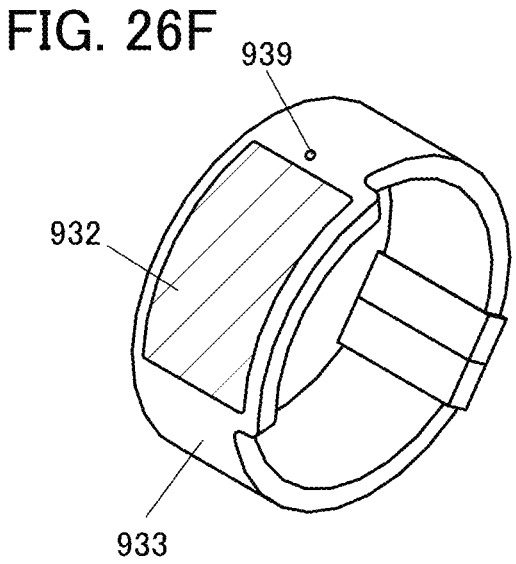

FIG. 26F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for the information terminal.

This embodiment can be combined with the other embodiments as appropriate.

REFERENCE NUMERALS a11: region, a13: region, a21: region, a31: region, a33: region, a41: region, a0111: region, a111: region, a112: region, a121: region, a0122: region, a122: region, a144: region, a0211: region, a211: region, a0221: region, a0222: region, a241: region, a242: region, a243: region, a244: region, a311: region, a344: region, a411: region, a441: region, a442: region, a443: region, a444: region, a1611: region, a1612: region, a1621: region, a1622: region, d11: image data, d33: image data, d44: image data, d0111: image data, d111: image data, d0122: image data, d144: image data, d0211: image data, d211: image data, d0222: image data, d244: image data, d311: image data, d344: image data, d411: image data, d444: image data, d1611: image data, d1622: image data, IM1: phase image data, IM2: phase image data, IM3: phase image data, IM4: phase image data, IM11: phase image data, IM14: phase image data, IM16: phase image data, IM21: phase image data, IM216: phase image data, IN11: phase image data, IN14: phase image data, IN21: phase image data, IN216: phase image data, KM1: lattice size, KM2: lattice size, 100: imaging device, 101: photoelectric conversion device, 102: transistor, 102*a*: transistor, 103: transistor, 103*a*: transistor, 104: capacitor, 105: transistor, 105*a*: transistor, 108: transistor, 108*a*: transistor, 112: wiring, 113: wiring, 114: wiring, 115: wiring, 116: wiring, 117: wiring, 118: wiring, 122: wiring, 133: conductive layer, 134: conductive layer, 135: conductive layer, 136: conductive layer, 138: conductive layer, 139: conductive layer, 161: transistor, 162: transistor, 163: capacitor, 202: capacitor, 203: transistor, 204: transistor, 205: transistor, 206: transistor, 207: resistor, 211: wiring, 212: wiring, 213: wiring, 215: wiring, 216: wiring, 217: wiring, 218: wiring, 219: wiring, 251: transistor, 252: transistor, 253: transistor, 254: transistor, 300: imaging region, 301: circuit, 302: circuit, 303: circuit, 303(1): circuit, 303(2): circuit, 303*e*: circuit, 304: circuit, 304*a*: circuit, 305: circuit, 313: wiring, 320: circuit, 320(1): circuit, 320(2): circuit, 320(3): circuit, 321: circuit, 322: switch, 323: switch, 330*a*: circuit, 330*b*: circuit, 331: circuit, 332: circuit, 332*a*: switch, 332*b*: switch, 332*c*: switch, 333: switch, 335: memory cell, 340: register, 341*a*: memory, 341*b*: memory, 341*c*: memory, 350: circuit, 361: selector circuit, 362: frame memory, 363: differential circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562*a*: layer, 562*b*: layer, 563: layer, 563*a*: layer, 563*b*: layer, 563*c*: layer, 565*a*: layer, 565*b*: layer, 566*a*: layer, 566*b*: layer, 566*c*: layer, 566*d*: layer, 567*a*: layer, 567*b*: layer, 567*c*: layer, 567*d*: layer, 567*e*: layer, 611: silicon substrate, 612: insulating layer, 613: insulating layer, 614: insulating layer, 615: insulating layer, 616: insulating layer, 617: insulating layer, 618: insulating layer, 619: conductive layer, 621: insulating layer, 622:

insulating layer, 623: insulating layer, 624: insulating layer, 625: insulating layer, 626: insulating layer, 627: conductive layer, 628: insulating layer, 629: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 641: insulating layer, 642: insulating layer, 643: insulating layer, 644: insulating layer, 645: insulating layer, 646: conductive layer, 647: insulating layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 673: microlens array, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising a first region and a second region in an imaging region,
    wherein the first region and the second region comprise the same number of a plurality of pixels,
    wherein the first region comprises a first pixel and a second pixel in the plurality of pixels,
    wherein the second region comprises the second pixel in the plurality of pixels,
    wherein first image data is generated in accordance with imaging signals output from the plurality of pixels in the first region,
    wherein second image data is generated in accordance with imaging signals output from the plurality of pixels in the second region, and
    wherein a first conceptual image is generated in accordance with the first image data and the second image data.

2. The imaging device according to claim 1,
    wherein the first image data is generated by averaging processing on the imaging signals output from the plurality of pixels in the first region, and
    wherein the second image data is generated by averaging processing on the imaging signals output from the plurality of pixels in the second region.

3. The imaging device according to claim 1,
    wherein each of the plurality of pixels in the first region is configured to convert the imaging signals output from the plurality of pixels into first imaging signals when supplied with weight coefficients,
    wherein each of the plurality of pixels in the second region is configured to convert the imaging signals output from the plurality of pixels into second imaging signals when supplied with the weight coefficients,
    wherein the first image data is generated by adding the first imaging signals output from the plurality of pixels in the first region together, and
    wherein the second image data is generated by adding the second imaging signals output from the plurality of pixels in the second region together.

4. The imaging device according to claim 1,
    wherein the first region and the second region are composed of the pixels selected using an integral row and an integral column as units.

5. The imaging device according to claim 1, further comprising a first circuit,
    wherein the first circuit is configured to retain a potential, and
    wherein the first circuit is configured as a substitution for the pixel in the first region or the second region.

6. The imaging device according to claim 1,
    wherein a transistor of the pixel comprises a metal oxide in a semiconductor layer.

7. A method for processing an image of an imaging device, the imaging device comprising:
    an imaging region provided with a plurality of pixels, comprising a first pixel, a second pixel, and a third pixel in the plurality of pixels,
    the method comprising:
    obtaining imaging signals by the plurality of pixels;
    setting a first region comprising the first pixel to the third pixel in the imaging region;
    generating first phase image data in accordance with the imaging signals obtained by the first pixel and the second pixel in the first region;
    generating second phase image data in accordance with the imaging signals obtained by the second pixel and the third pixel in the first region; and
    generating first image data by performing arithmetic operation on the first phase image data and the second phase image data.

8. The method for processing an image of an imaging device according to claim 7,
    wherein the first image data is an image comprising a feature extracted from the imaging signal.

* * * * *